(12) United States Patent  
Momokawa

(10) Patent No.: US 7,964,963 B2
(45) Date of Patent: Jun. 21, 2011

(54) SEMICONDUCTOR PACKAGE AND METHOD FOR MANUFACTURING SEMICONDUCTOR PACKAGE

(75) Inventor: Yuki Momokawa, Tokyo (JP)

(73) Assignee: NEC Corporation, Tokyo (JP)

( * ) Notice: Subject to any disclaimer, the term of this patent is extended or adjusted under 35 U.S.C. 154(b) by 123 days.

(21) Appl. No.: 12/441,418

(22) PCT Filed: Oct. 2, 2007

(86) PCT No.: PCT/JP2007/069251
§ 371 (c)(1),
(2), (4) Date: Mar. 16, 2009

(87) PCT Pub. No.: WO2008/044537
PCT Pub. Date: Apr. 17, 2008

(65) Prior Publication Data
US 2009/0315176 A1 Dec. 24, 2009

(30) Foreign Application Priority Data

Oct. 5, 2006 (JP) .................. 2006-273996

(51) Int. Cl.
*H01L 23/48* (2006.01)
*H01L 21/4763* (2006.01)
(52) U.S. Cl. ........ 257/737; 257/750; 257/758; 438/618; 438/637; 438/652
(58) Field of Classification Search ........... 438/618, 438/622, 625, 637, 642, 652, 669; 257/737, 257/750, 758
See application file for complete search history.

(56) References Cited

U.S. PATENT DOCUMENTS 6,605,528 B1 * 8/2003 Lin et al. .................... 438/618
6,621,164 B2 * 9/2003 Hwang et al. ............... 257/738

FOREIGN PATENT DOCUMENTS

| CN | 1477704 A | 2/2004 |
| CN | 1551319 A | 12/2004 |
| JP | 1990284426 A | 11/1990 |
| JP | 2000133683 A | 5/2000 |
| JP | 2001291721 A | 10/2001 |
| JP | 2002043462 A | 2/2002 |
| JP | 2002208655 A | 7/2002 |
| JP | 2003174118 A | 6/2003 |
| JP | 2003324119 A | 11/2003 |
| JP | 2005217445 A | 8/2005 |
| WO | 2006057360 A | 6/2006 |

OTHER PUBLICATIONS

International Search Report for PCT/JP2007/069251 mailed Dec. 25, 2007.
Chinese Office Action for CN200780037348.6 dated Feb. 5, 2010.

* cited by examiner

*Primary Examiner* — Kevin M Picardat

(57) ABSTRACT

A semiconductor package of this invention includes external electrode pad 5 which is formed by a conductive member that is made either of conductive resin or conductive ink, which is connected to an internal circuit of a semiconductor device, and which is to be electrically connected to an external portion, plating layer 6 which is provided on an entire surface of external electrode pad 5, and insulating resin layer 7 which covers plating layer 6 on a peripheral edge of external electrode pad 5, and which exposes a portion of plating layer 6 on external electrode pad 5.

23 Claims, 35 Drawing Sheets

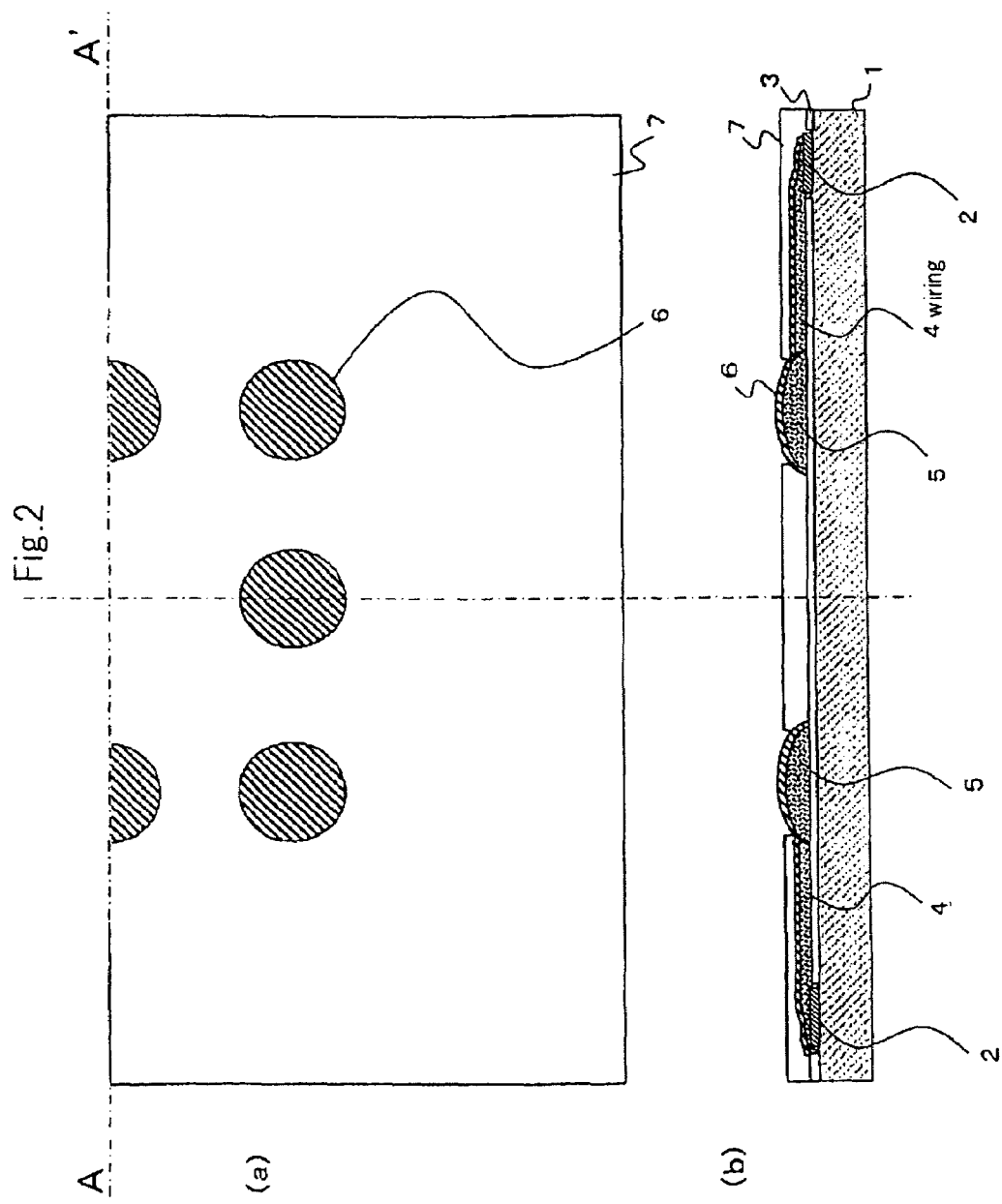

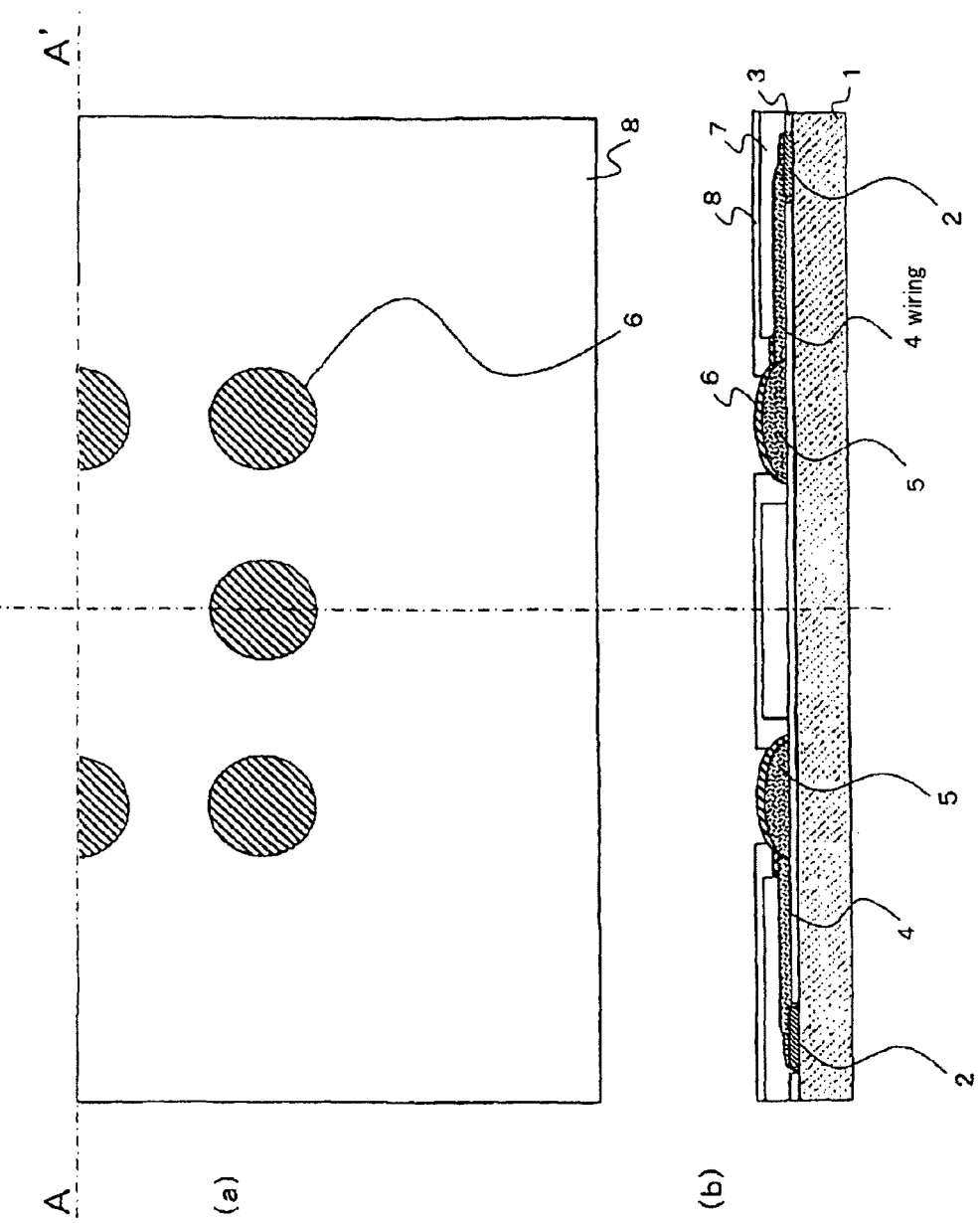

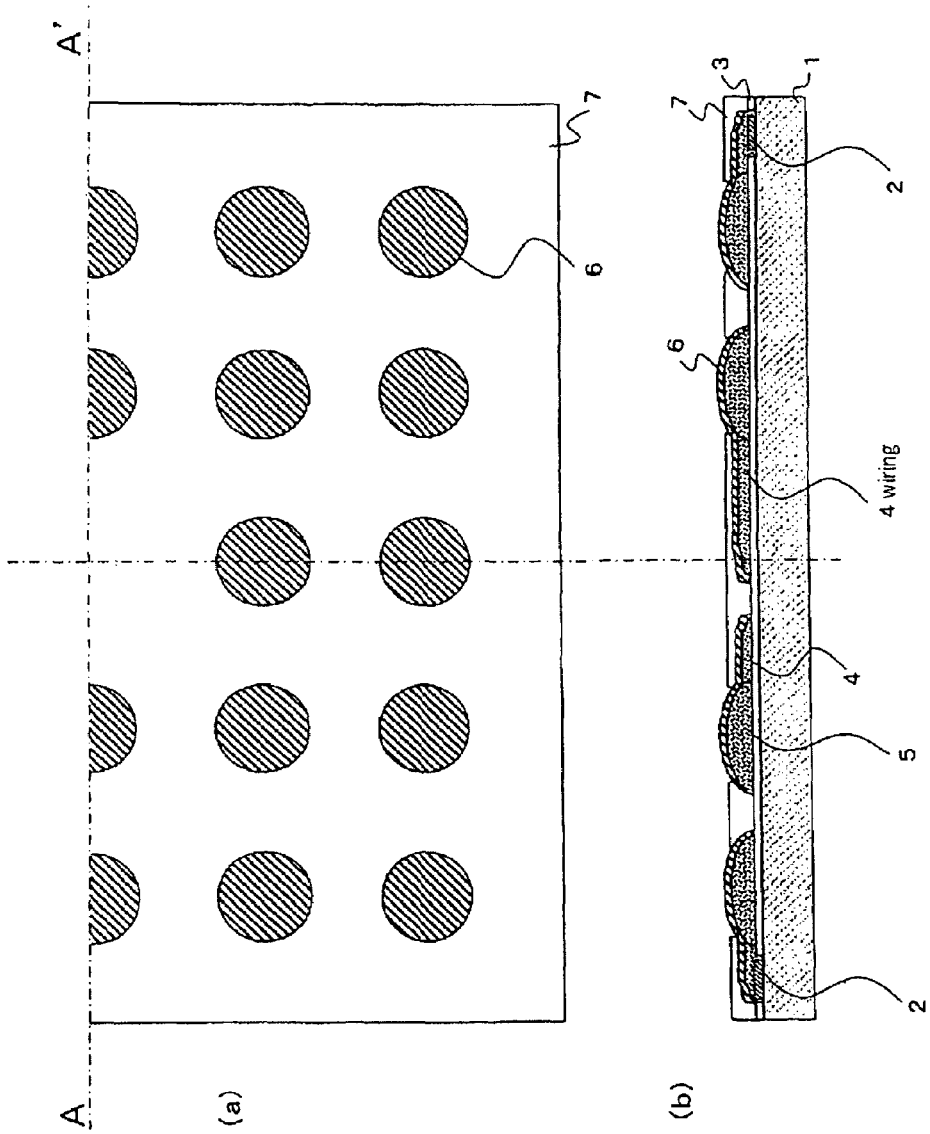

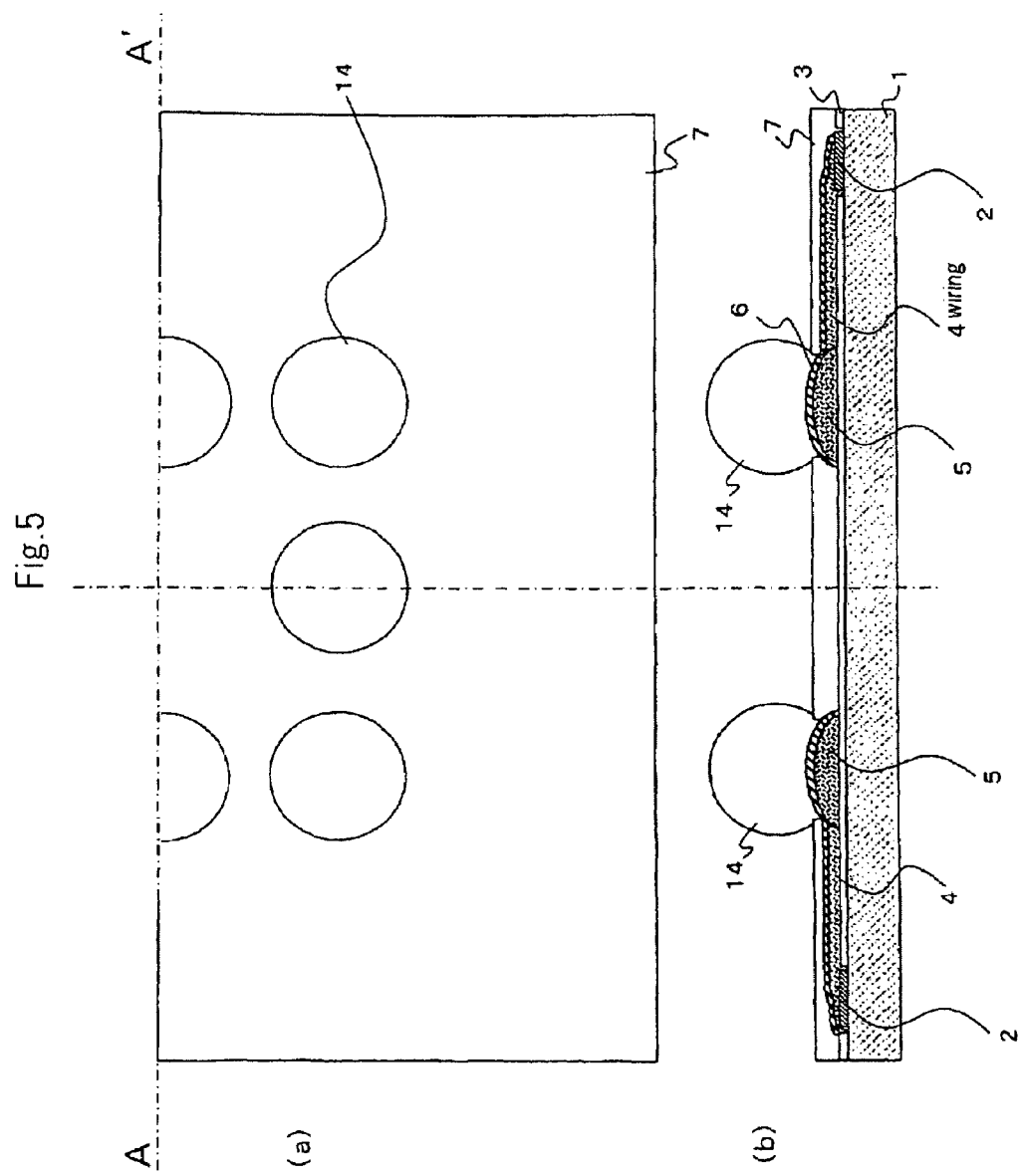

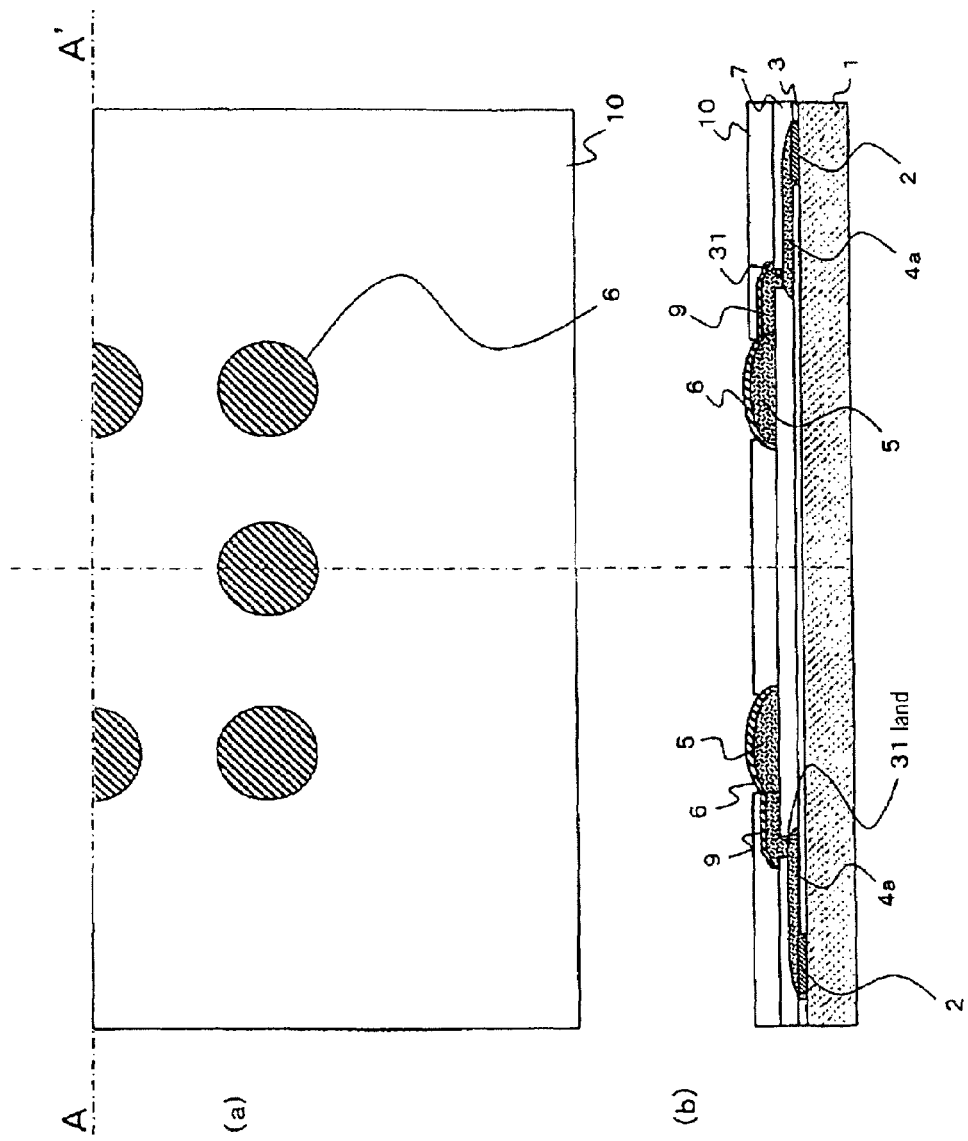

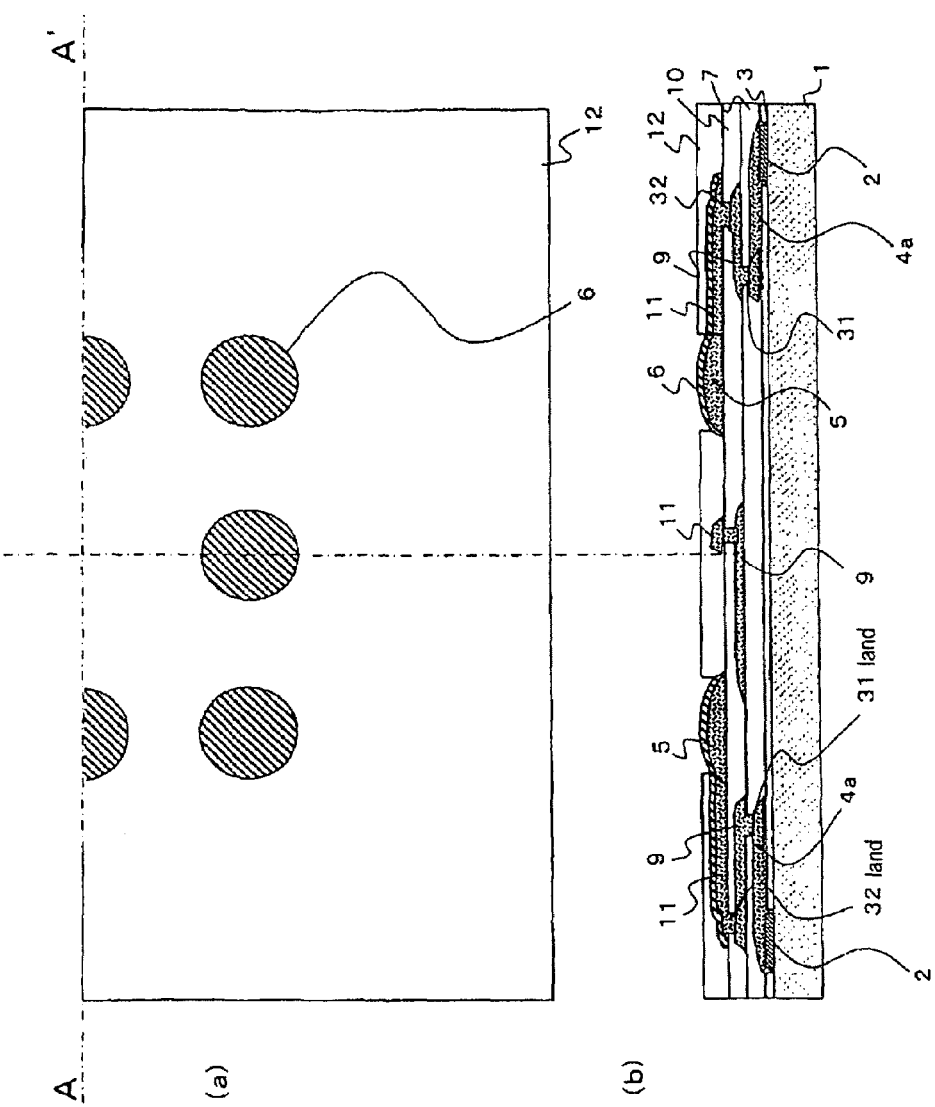

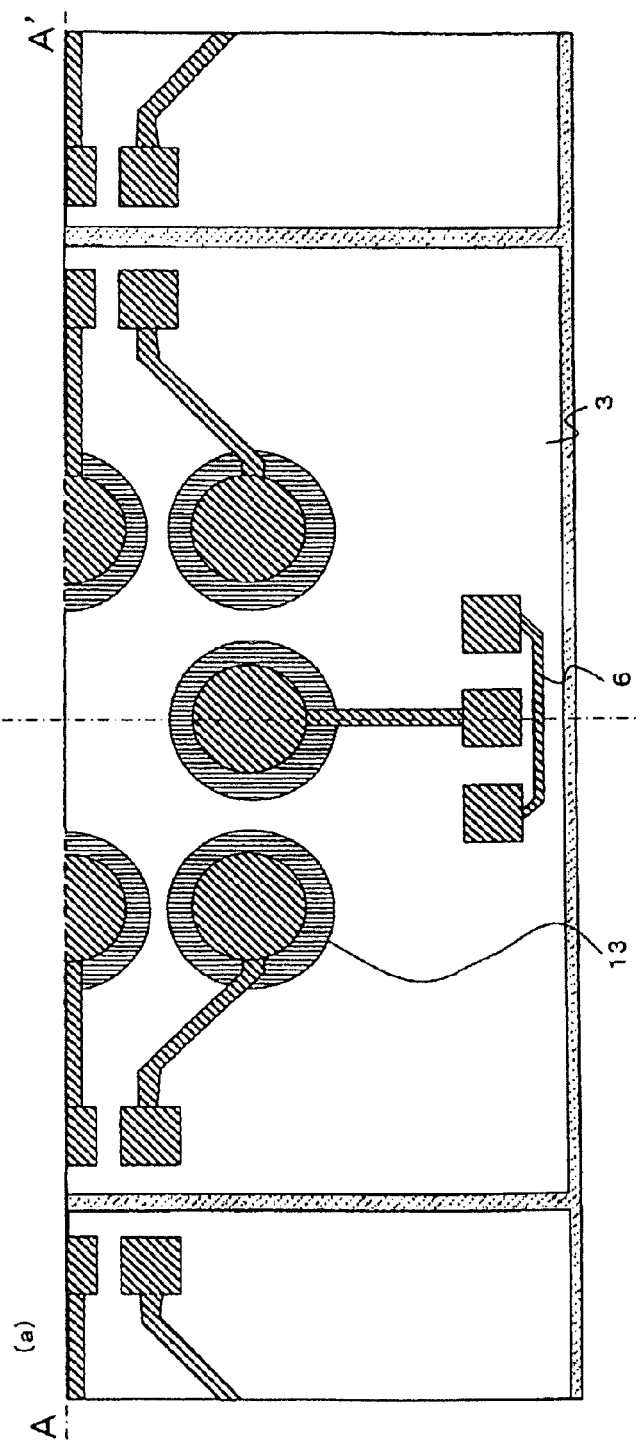
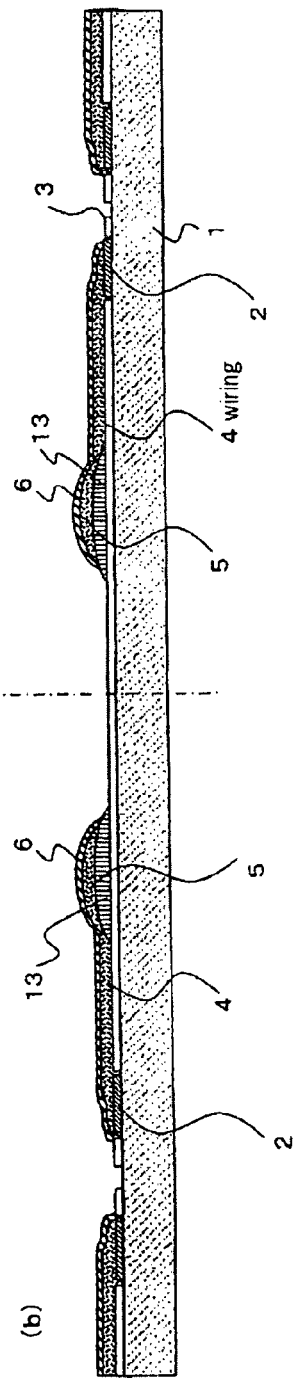
Fig. 34

Fig.35
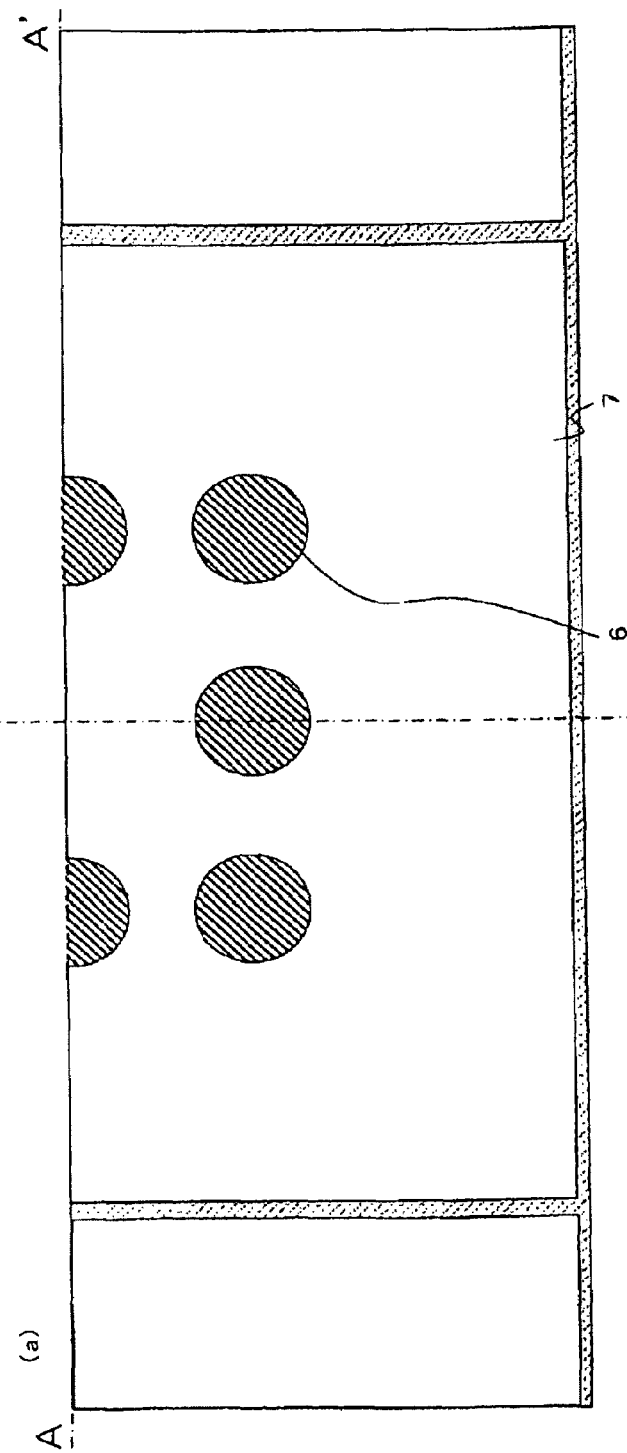
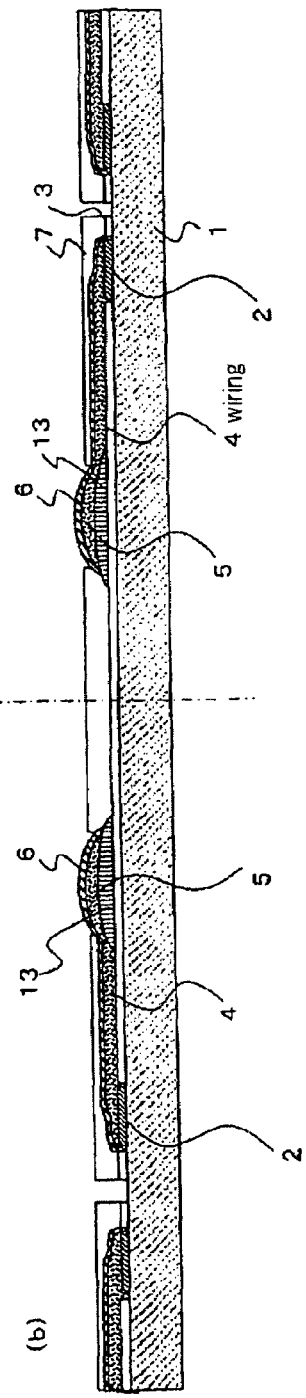

SEMICONDUCTOR PACKAGE AND METHOD FOR MANUFACTURING SEMICONDUCTOR PACKAGE

This application is the National Phase of PCT/JP2007/069251, filed Oct. 2, 2007, which is based upon and claims the benefit of priority from Japanese Patent Application No. 2006-273996 filed on Oct. 5, 2006, the content of which is incorporated by reference.

TECHNICAL FIELD

The present invention relates to a semiconductor package in which an electronic part including a semiconductor device is packaged in an insulator, and to a method for manufacturing the semiconductor package.

BACKGROUND ART

The wiring used in semiconductor packages (hereinafter referred to as LSI packages) is conventionally formed by using a photolithographic method. This wiring structure and wiring forming method are described in detail with reference to FIGS. 1A to 1I.

LSI chip electrode pad 2 connected to internal circuits is provided on a main surface of LSI chip 1. First insulating resin 3 is formed on the main surface, leaving a portion corresponding to chip electrode 2 exposed. On first insulating resin 3 of the substrate including LSI chip 1, copper film 15, which is a wiring layer base, is formed by sputtering or the like, as shown in FIG. 1A. Next, photosensitive resin 16 to be used as an etching resist is applied by spin coating or the like (FIG. 1B). Thereafter, as shown in FIG. 1C, photomask 17 is used to expose and develop a portion for forming a pattern. As a result, photosensitive resin 16 is divided into unexposed portion 16a and exposed portion 16b (FIG. 1D).

Next, the resin of unexposed portion 16a, which is the resin outside developed portion 16c, is removed to form an etching resist (FIG. 1E). By etching away the copper outside a wiring portion forms, copper wiring 18 is formed as the wiring pattern (FIG. 1F). Thereafter, the etching resist is removed (FIG. 1G).

Next, to protect copper wiring 18, second insulating resin 7 is formed as a solder resist on portions other than external electrode pads (FIG. 1H). Further, to form a barrier layer to suppress diffusion of copper into solder that is to be provided on the external electrode pads, plating layer 6 made either of Ni, Ni/Au, Ni/Pd/Au or the like is formed (FIG. 1I). Thus the manufacture of the wiring used in the LSI package is completed.

A further method, which also makes use of photolithography as well as the above-described method, is disclosed in Japanese Patent Laid-Open No. 2003-174118.

DISCLOSURE OF THE INVENTION

However, the above-described wiring has problems from an environmental standpoint. For instance, it is necessary to remove all copper except copper of the wiring in the manufacturing process and the etching liquid becomes waste liquid after use. Further problems are that initial capital investment is enormous, because a complex process of the type described above is required, and that high costs are unavoidable, because a large number of manufacturing processes are required.

In recent years, instead of forming wiring using the so-called photolithographic methods described above, attempts have been made to form wiring using conductive resin or conductive ink by applying for printing. However, when conductive resin or conductive ink is used to form wiring, a reduction in resistivity is required. Hence, there is a tendency for the conducting filler content to be high and the resin content to be low. As a result, adhesion strength with respect to the substrate and strength of the resin itself are insufficient. From experiments by the inventor, it was discovered that there was a marked drop in reliability when soldering was performed on the wiring and, thus, that the use of such wiring as LSI package wiring was problematic.

The present invention was conceived to solve the problems of the above-described technology with the object of providing a highly reliable and environmentally friendly semiconductor package, and manufacturing method for the semiconductor package.

The semiconductor package of the present invention includes, an external electrode pad which is formed by a conducting member that is made either of conductive resin or conductive ink, the external electrode pad being connected to an internal circuit of a semiconductor device, the external electrode to be electrically connected to an external portion, a plating layer which is provided on an entire surface of the external electrode pad, and an insulating resin layer which covers the plating layer on a peripheral edge of the external electrode pad, the insulating resin layer exposing a portion of the plating layer on the external electrode pad.

In the present invention, the external electrode pad made either of the conductive resin or conductive ink is covered by the plating layer and insulation resin is applied to the plating layer so as to cover a portion corresponding to the peripheral edge of the external electrode pad. With this structure, insulating resin edges at which cracking can originate about to the plating layer. The plating layer is formed from a bulk metal and thus less prone to cracking than the conductive resin which is formed from a resin and metal composite material. As a result, cracks originating at the insulating resin edges due to stress concentrations are less likely to enter the external electrode pad.

According to the present invention, cracking and peeling is prevented from occurring in the external electrode pad and reliability is thereby improved over the related art. Further, the use of the conductive resin or conductive ink in a member of the electrode pad not only allows a reduction in the load on the environment in comparison to lithographic techniques, but also lowers capital costs in comparison to lithographic techniques.

BRIEF DESCRIPTION OF THE DRAWINGS

FIG. 2 is a top view and cross-sectional view schematically showing an LSI package according to a first exemplary embodiment;

FIG. 3 is a top view and cross-sectional view schematically showing an LSI package with a differing construction, according to the first exemplary embodiment;

FIG. 4 is a top view and cross-sectional view schematically showing an LSI package with another differing construction, according to the first exemplary embodiment;

FIG. 5 is a top view and cross-sectional view showing an example of a case in which solder bumps are formed on the LSI package of the first exemplary embodiment;

FIG. 9 is a top view and cross-sectional view schematically showing an LSI package according to a second exemplary embodiment;

FIG. 10 is a top view and cross-sectional view schematically showing an LSI package according to a third exemplary embodiment;

FIG. 34 is a top view and cross-sectional view schematically showing a manufacturing process for the LSI package shown in FIG. 13; and FIG. 35 is a top view and cross-sectional view schematically showing a manufacturing process for the LSI package shown in FIG. 13.

DESCRIPTION OF SYMBOLS

Figure 1A:
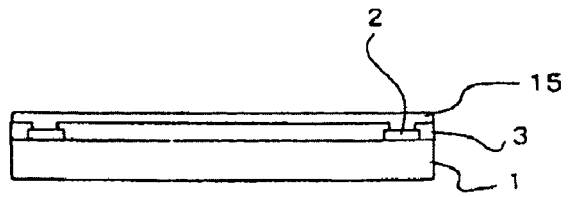
FIG. 1A is a cross-sectional view for schematically showing an example of an LSI package manufacturing method of the related art.
Figure 1B:
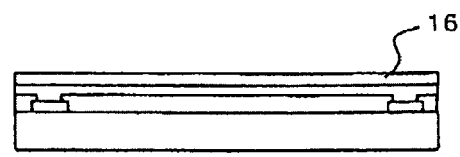
FIG. 1B is a cross-sectional view for schematically showing the example of the LSI package manufacturing method of the related art.
Figure 1C:
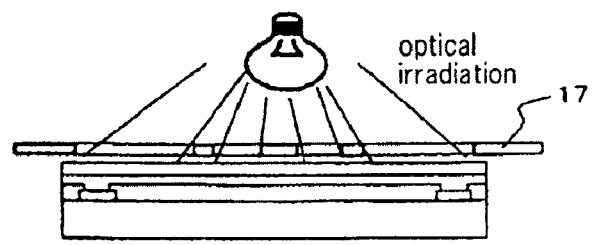
FIG. 1C is a cross-sectional view for schematically showing the example of the LSI package manufacturing method of the related art.
Figure 1D:
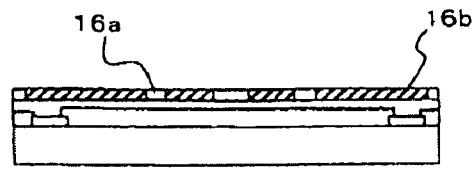
FIG. 1D is a cross-sectional view for schematically showing the example of the LSI package manufacturing method of the related art.
Figure 1E:
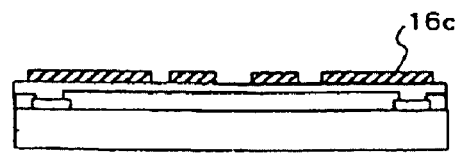
FIG. 1E is a cross-sectional view for schematically showing the example of the LSI package manufacturing method of the related art.
Figure 1F:
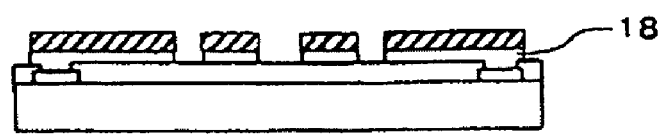
FIG. 1F is a cross-sectional view for schematically showing the example of the LSI package manufacturing method of the related art.
Figure 1G:
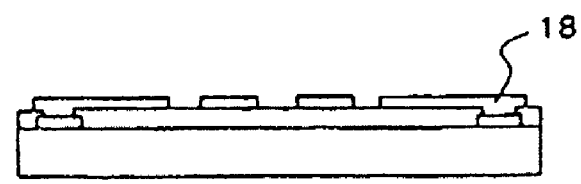
FIG. 1G is a cross-sectional view for schematically showing the example of the LSI package manufacturing method of the related art.
Figure 1H:
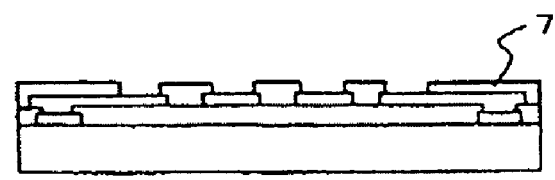
FIG. 1H is a cross-sectional view for schematically showing the example of the LSI package manufacturing method of the related art.
Figure 1I:
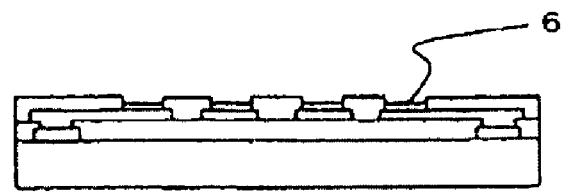
FIG. 1I is a cross-sectional view for schematically showing the example of the LSI package manufacturing method of the related art.

1 LSI chip (wafer)
2 LSI chip electrode pad
3 first insulating resin
4a first wiring
5 external electrode pad
6 plating layer
7 second insulating resin 31, 32 land
9 second wiring
8, 10 third insulating resin
11 third wiring
12 fourth insulating resin
13 stress mitigating layer
14 solder bump
15 copper film
16 photosensitive resin
16a photosensitive resin (unexposed portion)
16b photosensitive resin (exposed portion)
16c photosensitive resin (developed portion)
17 photomask
18 copper wiring

BEST MODE FOR CARRYING OUT THE INVENTION

First Exemplary Embodiment

The structure of the LSI package of the exemplary embodiment is described.

FIG. 2 is a schematic view showing an example of a basic structure of the LSI package of the exemplary embodiment. FIG. 2(a) is a top view, and FIG. 2(b) is a cross-sectional view taken along line AA' in FIG. 2(a).

As shown in FIG. 2, the LSI package includes, formed on a surface of LSI chip 1, LSI chip electrode pad 2, first insulating resin 3, wiring 4, external electrode pad 5, plating layer 6 and second insulating resin 7. LSI chip electrode pad 2 is a terminal connected to a circuit (not shown) in LSI chip 1 and external electrode pad 5 is a terminal for electrically connecting to the outside.

First insulating resin 3 is provided on a surface of LSI chip 1, and LSI chip electrode pad 2 is provided in the same layer as first insulating resin 3. With this structure, as can be seen from the cross-sectional view in FIG. 2(b), LSI chip electrode pad 2 is exposed in an opening provided in first insulating resin 3.

Wiring 4 is provided on first insulating resin 3, and connected at one end to LSI chip electrode pad 2. External electrode pad 5 is provided on first insulating resin 3 and connected to the other end portion of wiring 4. LSI chip electrode pad 2 and external electrode pad 5 are connected via wiring 4.

Wiring 4 and external electrode pad 5 are covered by plating layer 6.

Second insulating resin 7 covers plating layer 6 that is provided on wiring 4, and a peripheral edge of plating layer 6 on external electrode pad 5. Wiring 4 and external electrode pad 5 are constructed from conductive resin or conductive ink.

Next, an example of another different structure of the LSI package of the exemplary embodiment is described.

FIG. 3 is a view of the different structure of the LSI package of the exemplary embodiment. FIG. 3(a) is a top view, and FIG. 3(b) is a cross-sectional view taken along line AA' in FIG. 3(a).

In the configuration shown in FIG. 3, third insulating resin 8 is provided on second insulating resin 7. Wiring 4 is partially covered by plating layer 6 that extends along the surface of wiring 4 from a connection portion with external electrode pad 5 to a predetermined region. The remaining surface of wiring 4 is covered by second insulating resin 7. The region over which plating layer 6 is formed on wiring 4 is determined according to how far second insulating resin 7 extends along wiring 4.

Plating layer 6 on wiring 4 is covered by third insulating resin 8. Further, external electrode pad 5 is covered by plating layer 6 in the same way as in FIG. 2, and the peripheral edge of plating layer 6 on external electrode pad 5 is covered by third insulating resin 8.

As shown in FIG. 3, with a configuration in which plating layer 6 on wiring 4 and a boundary of second insulating resin 7 are covered by insulating resin, a portion of wiring 4 may be covered with plating layer 6 and the remaining region covered with insulating resin. Note, however, that if conductive resin is used for wiring 4 and external electrode pad 5 and silver is used as a conducting filler in the conductive resin, ion migration which can cause shorting between wiring is more likely to occur. In this case, resistance to ion migration can be improved by covering all the wiring with plating layer 6.

There are no limits on the material used for plating layer 6, provided that it has favorable electrical properties and allows soldering. However, a material selected from among Cu, Ni, Ni/Au, Ni/Pd/Au and the like, is preferable. It is also desirable that the surface of plating layer 6 is roughened by grinding, blast processing, plasma processing, chemical treatment or the like. Roughening of the surface of plating layer 6 improves adhesiveness with respect to the insulating resin.

Next, the materials used in the construction of the LSI package of the exemplary embodiment are described.

Conducting members of wiring 4 and external electrode pad 5 are, for instance, sintered products of minute metal particles (gold, silver, copper or the like). Wiring 4 and external electrode pad 5 can be formed by using a metal particle-containing conductive resin or conductive ink (including an organic-inorganic composite with conductive particles dispersed therein) or the like.

Further, to achieve high pin densities and high wiring densities with the structure of the exemplary embodiment, the pitch of wiring 4 and external electrode pad 5 is preferably reduced. To allow a reduction in pitch, a particle dimension of the conducting filler, which is an ingredient of the conductive paste and conductive ink, is preferably 5 μm or less, and more preferably approximately 3 μm to 0.5 μm. Printing becomes easier as the particle dimension reduces, but contact resistance increases if the particle dimension is reduced too far. Thus, the above-described range is preferable.

Moreover, the ingredient preferably includes minute metal particles having a particle diameter of approximately 20 nm to 10 nm (inclusive), and may contain minute metal particles having a particle diameter as low as approximately 5 nm. Metals have property of fusing at low temperature when particle size is approximately 20 nm or less. The inclusion of such minute metal particles in wiring 4 and external electrode pad 5 not only enables the pitch to be reduced, but allows at the same time an improvement in conductivity due to particle fusion.

The optimal values for the above-described particle dimensions of the conducting filler and the minute metal particles included in the filler ingredients are substantially the same in the other exemplary embodiments described below.

First insulating resin 3 can be a material used as a conventional passivation film, such as a polyimide or PBO (Poly-Benzoxazole), but is not limited to being this material. Further, second insulating resin 7 is preferably an epoxy-type resin, but is not limited to this. Any material may be used, provided that it is capable of suppressing the ion migration that occurs in the wiring due to the inclusion of conducting members such as the conductive resin, conductive ink and the like, and has favorable adhesiveness with respect to the wiring and the substrate and excellent thermal resistance.

Note that, although in FIG. 2 the external electrode pads have, for convenience, been given a simple arrangement, the electrode pads are not limited to this arrangement and may take up a different arrangement. FIG. 4 shows an example of a different pad arrangement.

FIG. 4(a) is a top view, and FIG. 4(b) is a cross-sectional view taken along line AA' in FIG. 4(a). FIG. 4 shows a configuration in which further pads are provided to an outer side of the pads shown in FIG. 2(a). As shown in FIG. 4(a), a different pad arrangement to that of FIG. 2(a) may be used.

Further, solder bumps can be formed on plating layer 6 formed on external electrode pad 5. FIG. 5 shows an example construction in which solder bumps are provided. FIG. 5(a) is a plan view, and FIG. 5(b) is a cross-sectional view taken along line AA' in FIG. 5(a). As shown in FIG. 5(b), solder bump 14 is provided on plating layer 6 that is formed on external electrode pad 5. FIG. 5 shows an example in which solder bump 14 has been formed by a solder ball. However, solder bumps may be formed by printing with a solder paste.

Next, a structure in which a solder bump is provided on the external electrode pad is described and compared to a conventional structure.

Figure 6A:
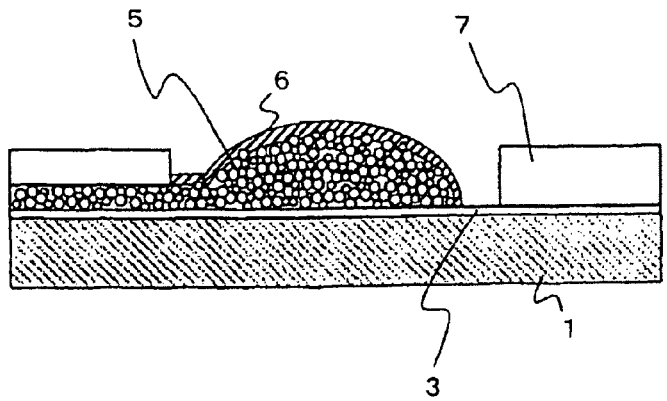
FIG. 6A is a cross-sectional view of package external electrode portions when conductive resin wiring is used in a package with a conventional structure.
Figure 6B:
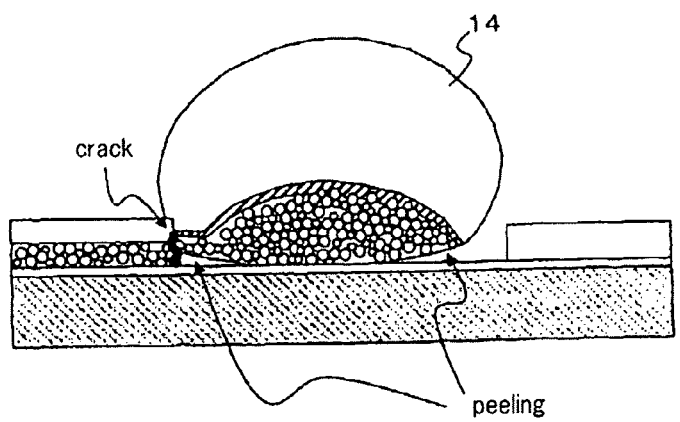
FIG. 6B is a cross-sectional view schematically showing an example of a fault which occurs as result of using the structure shown in FIG. 6A.

FIG. 6A is a cross-sectional view showing an example configuration of a conventional external electrode pad. FIG. 6B is a cross-sectional view of a case in which a solder bump has been formed on the external electrode pad shown in FIG. 6A. In these views, the external electrode pad portions are enlarged.

Conventionally, in an LSI package manufacturing process, plating layer 6 is formed on external electrode pad 5 after forming the uppermost layer insulating resin (second insulating resin 7 in FIG. 6A). In FIG. 6A, an opening provided in second insulating resin 7 is larger than external electrode pad 5. Since external electrode pad 5 is smaller than the opening, plating layer 6 covers a portion of wiring. Also, a gap is formed between external electrode pad 5 and second insulating resin 7.

FIG. 6B shows a structure in which solder bump 14 has been formed on external electrode pad 5 shown in FIG. 6A. When solder bump 14 is formed on external electrode pad 5, a force works to lift an end portion of external electrode pad 5 due to forces of contraction as the solder solidifies. Hence, if, as shown in FIG. 6B, a peripheral edge portion of external electrode pad 5 is not covered by the uppermost layer insulating resin (second insulating resin 7), and peeling can occur between the substrate (here, first insulating resin 3) and external electrode pad 5. Consequently, the adhesive strength between external electrode pad 5 and the substrate is markedly reduced and cracks enter the wiring from a boundary between second insulating resin 7 and plating layer 6, causing conduction faults in the wiring. The following describes a further conventional structure for suppressing peeling at the end portions of the pad.

Figure 7A:
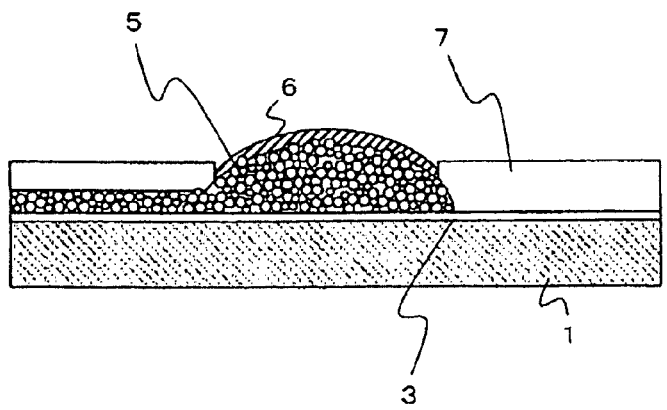
FIG. 7A is a cross-sectional view of the package external electrode portion when conductive resin wiring is used in a package with a conventional structure.
Figure 7B:
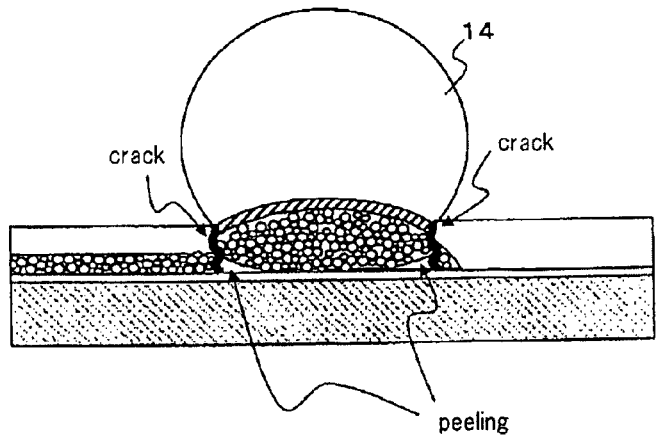
FIG. 7B is a cross-sectional view schematically showing an example of a fault which occurs as result of using the structure shown in FIG. 7A.

FIG. 7A is a cross-sectional view showing a further example configuration of a conventional external electrode pad. FIG. 7B is a cross-sectional view of a case in which a solder bump has been formed on the external electrode pad shown in FIG. 7A.

As shown in FIG. 7A, the opening provided in the uppermost layer insulating resin (second insulating resin 7) is smaller than external electrode pad 5. Conventionally, in the LSI package manufacturing process, plating layer 6 is formed on external electrode pad 5 after forming the insulating resin of the uppermost layer. Hence, with this structure, plating layer 6 extends from a central portion to a periphery of external electrode pad 5 and the peripheral edge portion of external electrode pad 5 is covered by second insulating resin 7. With this structure, peeling of the type described with reference to FIG. 6B is suppressed.

However, when the uppermost layer insulating resin is formed to cover the peripheral edge of external electrode pad 5 as shown in FIG. 7A and solder bump 14 is formed, the contracting forces of the solidifying solder can cause cracks to enter external electrode pad 5 from between plating layer 6 and the uppermost layer insulating resin, as shown in FIG. 7B. As a result, conduction faults can occur in the wiring. Further, since the cracks can propagate and cause peeling to occur between the substrate and external electrode pad 5, the adhesive force between the substrate and external electrode pad 5 is markedly reduced.

Figure 8A:
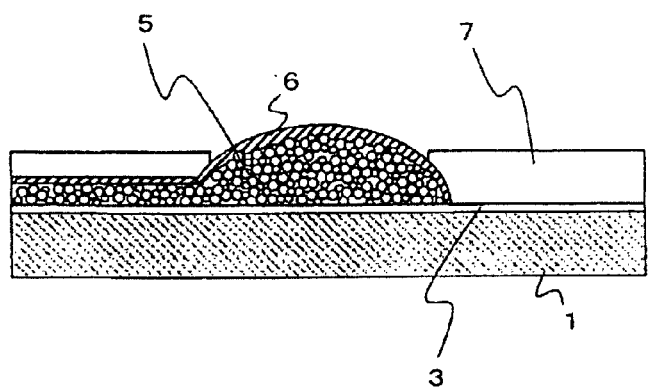
FIG. 8A is a cross-sectional view showing a general example of a structure of an external electrode pad of an LSI package of the present invention.
Figure 8B:
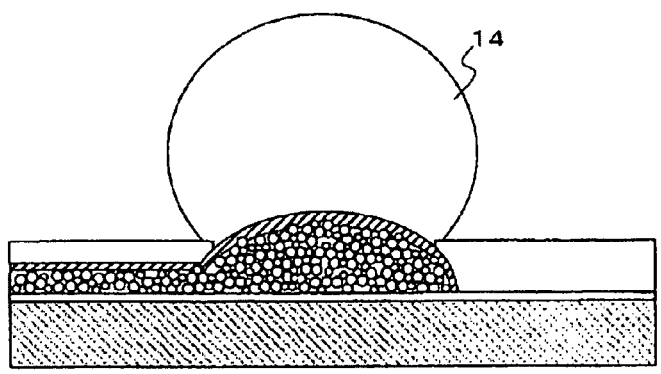
FIG. 8B is a cross-sectional outline view showing an advantage resulting from the structure shown in FIG. 8A.

The following describes an LSI package structure of the exemplary embodiment. FIG. 8A is a cross-sectional view showing an example configuration of an external electrode pad of the exemplary embodiment. FIG. 8B is a cross-sectional view of a case in which a solder bump has been formed on the external electrode pad shown in FIG. 8A.

In the exemplary embodiment, after plating layer 6 is formed on the wiring and package external electrodes, an uppermost layer insulating resin (second insulating resin 7) is then formed on the wiring, and on a substrate (first insulating resin 3) to cover a peripheral edge of external electrode pad 5, giving the structure shown in FIG. 8A. In the structure shown in FIG. 8A, no boundary exists between the uppermost layer insulating resin and plating layer 6. An edge of the uppermost layer insulating resin exists on plating layer 6. However, being made of bulk metal, plating layer 6 is less susceptible to cracking than the conductive resin and conductive ink, which are composites of resin and metal. Hence, even if the edge region of the uppermost layer insulating resin on plating layer 6 is placed under stress, the occurrence of cracks in the conductive member of external electrode pad 5 is prevented. Consequently, even when a solder bump is formed as shown in FIG. 8B, the occurrence of the above-described cracking and peeling can be prevented.

Further, covering the peripheral edge of external electrode pad 5 with the insulating resin reinforces the adhesiveness between external electrode pad 5 and the under layer.

As described above, the LSI package of the exemplary embodiment prevents cracking and peeling of the wiring and external electrode pad, and therefore improves reliability over the related art. Forming the wiring layer using a printing method not only allows a reduction in the load on the environment in comparison to lithographic techniques, but also lowers capital costs in comparison to lithographic techniques.

Second Exemplary Embodiment

An LSI package of the exemplary embodiment has a configuration in which LSI chip electrode pads and external electrode pads are connected via lands and first wiring. The structure of the LSI package of the exemplary embodiment is described below.

FIG. 9 is a schematic view of an example of a basic structure of the LSI package of the exemplary embodiment. FIG. 9(a) is a top view, and FIG. 9(b) is a cross-sectional view taken along line AA' in FIG. 9(a).

As shown in FIG. 9, the LSI package includes, formed on a surface of LSI chip 1, LSI chip electrode pad 2, first insulating resin 3, first wiring 4a, external electrode pad 5, plating layer 6, second insulating resin 7, land 31, second wiring 9 and third insulating resin 10.

First insulating resin 3 and LSI chip electrode pad 2 are formed in the same layer on the surface of LSI chip 1. One end portion of first wiring 4a is provided on first insulating resin 3 and connected to LSI chip electrode pad 2. Second insulating resin 7 is provided on first insulating resin 3. External electrode pad 5 and second wiring 9 connected to external electrode pad 5 are provided on second insulating resin 7.

One end portion of second wiring 9 is connected to the other end portion of first wiring 4a via an opening in second insulating resin 7. The connection portion is called land 31. The other end portion of second wiring 9 is connected to external electrode pad 5. Third insulating resin 10 is provided on second insulating resin 7.

Conducting members of first wiring 4a, land 31, second wiring 9 and external electrode pad 5 are constructed by using conductive resin or conductive ink. Conducting member portions corresponding to an uppermost layer are covered by plating layer 6. Specifically, as shown in FIG. 9(b), plating layer 6, which is formed on second wiring 9 and external electrode pad 5 portions corresponding to the uppermost layer, is coated by third insulating resin 10 except in a region extending from the center of external electrode pad 5 to a position near the periphery of external electrode pad 5. With this configuration, third insulating resin 10 covers a peripheral edge of external electrode pad 5.

As described above, although the LSI package of the exemplary embodiment has multiple wiring layers, cracking and peeling of the wiring and external electrode pad are prevented, and an improvement in reliability over the related art is achieved. Forming the electrode pads using a printing method not only allows a reduction in the load on the environment in comparison to lithographic techniques, but also lowers capital costs in comparison to lithographic techniques.

Note that, the LSI package of the exemplary embodiment may, as shown in FIG. 3, be structured with plating layer 6 provided on external electrode pad 5 and at least a portion of the connected wiring, and the peripheral edge of plating layer 6 on external electrode pad 5 covered by insulating resin. Note that, when conductive resin is used for the conducting members and silver is used for the conducting filler of the conductive resin, resistance to ion migration can be improved by covering all wiring with plating layer 6. In this case, plating layer 6 may cover not only wiring of the uppermost layer, but also wiring of internal layers.

As in the first exemplary embodiment, the material used for plating layer 6 may be any material that has favorable electrical properties and allows soldering, but is preferably Cu, Ni, Ni/Au, Ni/Pd/Au, or the like. It is desirable that the surface of plating layer 6 is roughened by grinding, blast processing, plasma processing, chemical treatment, or the like. Roughening of the surface of plating layer 6 improves adhesiveness with respect to the insulating resin.

Further, the conducting members of first wiring 4a, land 31, second wiring 9 and external electrode pad 5 can, as in the first exemplary embodiment, be formed by using the sintered product of minute metal particles (minute particles of gold, silver, copper or the like), conductive resin or conductive ink (including an organic-inorganic composite with minute conductive particles dispersed therein) and the like.

Further, to achieve high pin densities and high wiring densities, a pitch of first wiring 4a, second wiring 9 and external electrode pad 5 is preferably reduced. To reduce the pitch, it is preferable to use, as an ingredient, conductive paste or conductive ink that is at least partially made up of minute metal particles having a particle diameter of approximately 20 nm or less. The advantage of including such minute metal particles is the same as that described in the first exemplary embodiment.

Further, as in the first exemplary embodiment, first insulating resin 3 can make use of a material used in conventional passivation films, such as a polyimide, PBO or the like. First insulating resin 3 is, however, not limited to being this material. Further, second insulating resin 7 and third insulating resin 10 are preferably an epoxy-type resin, but are not limited to this. Any material may be used, provided that it is capable of suppressing the ion migration occurring in the wiring as a result of the conducting members of the conductive resin, conductive ink and the like, and that it has favorable adhesiveness with respect to the wiring and the substrate and excellent thermal resistance.

Further, although in FIG. 9 the external electrode pads have, for convenience, been given a simple arrangement, it goes without saying that the electrode pads are not limited to this arrangement and may take up a different arrangement, such as the one shown in FIG. 4.

Further, solder bumps can be formed on external electrode pad 5 via plating layer 6 as shown in FIG. 5. Although FIG. 5 shows an example in which the solder bumps are formed by solder balls, the solder bumps may be formed by using a solder paste printing.

Third Exemplary Embodiment

An LSI package of the exemplary embodiment relates to a packaged electronic component including an LSI chip. The structure of the LSI package of the exemplary embodiment is described below.

FIG. 10 schematically shows an example of a basic structure of an LSI package of the exemplary embodiment. FIG. 10(a) is a top view, and FIG. 10(b) is a cross-sectional view taken along line AA' in FIG. 10(a).

As shown in FIG. 10, the LSI package includes, formed on a surface of LSI chip 1, LSI chip electrode pad 2, first insulating resin 3, first wiring 4a, external electrode pad 5, plating layer 6, second insulating resin 7, lands 31 and 32, second wiring 9, third insulating resin 10, third wiring 11, and fourth insulating resin 12.

First insulating resin 3 and LSI chip electrode pad 2 are formed in the same layer on the surface of LSI chip 1. One end portion of first wiring 4a is provided on first insulating resin 3 and connected to LSI chip electrode pad 2. Second insulating resin 7 is provided on first insulating resin 3, and second wiring 9 is formed on second insulating resin 7.

One end portion of second wiring 9 is connected to the other end portion of first wiring 4a via an opening in second insulating resin 7. This connection portion is called land 31. Third insulating resin 10 is provided on second insulating resin 7. External electrode pad 5 and third wiring 11 that is connected to external electrode pad 5 are provided on third insulating resin 10.

One end portion of third wiring 11 is connected to the other end portion of second wiring 9 via an opening in third insulating resin 10. This connection portion is called land 32. The other end portion of third wiring 11 is connected to external electrode pad 5. Fourth insulating resin 12 is provided on third insulating resin 10.

Conducting members of first wiring 4a, lands 31 and 32, second wiring 9, third wiring 11 and external electrode pad 5 are constructed by using conductive resin or conductive ink. Conducting member portions corresponding to an uppermost layer are covered by plating layer 6. Specifically, as shown in FIG. 10(b) third wiring 11 and external electrode pad 5 correspond to portions of the uppermost layer. Plating layer 6 is coated by fourth insulating resin 12 except in a region extending from the center of external electrode pad 5 to a position near the periphery of external electrode pad 5. With this configuration, fourth insulating resin 12 covers a peripheral edge of external electrode pad 5.

Further, in order to support the miniaturization of internal circuits of LSI chip 1 or to form passive components such as L, C and R using conductive resin or conductive ink, second wiring 9 and third wiring 11 are provided and connected via land 32.

As described above, the LSI package of the exemplary embodiment prevents cracking and peeling of the wiring and external electrode pad, and thereby improves reliability over the related art. Forming the electrode pads using a printing method not only allows a reduction in the load on the environment in comparison to lithographic techniques, but also lowers capital costs in comparison to lithographic techniques.

Note that the number of wiring layers connecting the LSI chip electrodes and external electrodes is not limited to three, and a multi-layer structure including four or more wiring layers is acceptable. The multi-layer structure has alternately provided insulating resin layers and wiring layers.

Further, as shown in FIG. 3, the LSI package of the exemplary embodiment may have a structure in which plating layer 6 is provided on external electrode pad 5 and at least a portion of the connected wiring, and the peripheral edge of plating layer 6 on external electrode pad 5 is covered by insulating resin. Note that when conductive resin is used for the conducting members and silver is used for the conducting filler of the conductive resin, resistance to ion migration can be improved by covering all wiring with plating layer 6.

Figure 11:
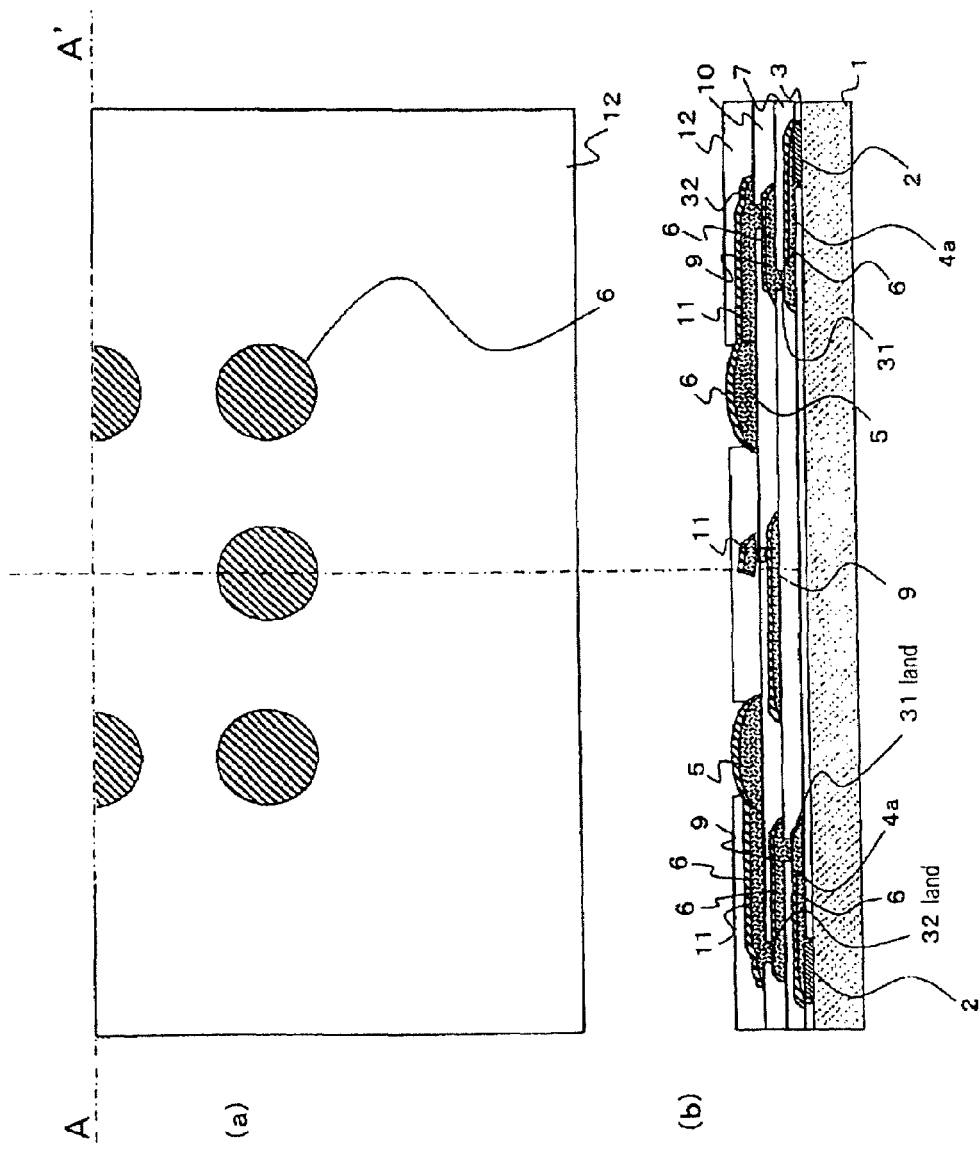
FIG. 11 is a top view and cross-sectional view schematically showing a modification example of the LSI package according to the third exemplary embodiment.

Moreover, in this case, plating layer 6 may cover not only wiring of the uppermost layer as shown in FIG. 11, but also wiring of internal layers. In the configuration shown in FIG. 11, plating layer 6 is further provided on upper surfaces of first wiring 4*a* and second wiring 9.

Further, as in the first exemplary embodiment, the material used for plating layer 6 may be any material having favorable electrical properties and allowing soldering, but is preferably Cu, Ni, Ni/Au, Ni/Pd/Au, or the like. It is desirable that the surface of plating layer 6 is roughened by grinding, blast processing, plasma processing, chemical treatment, or the like. Roughening of the surface of plating layer 6 improves adhesiveness with respect to the insulating resin.

Further, the conducting members of first wiring 4*a*, land 31, second wiring 9 and external electrode pad 5 can, as in the first exemplary embodiment, be formed by using the sintered product of minute metal particles (minute particles of gold, silver, copper or the like), conductive resin or conductive ink (including an organic-inorganic composite with minute conductive particles dispersed therein) and the like.

Further, to achieve high pin densities and high wiring densities, a pitch of first wiring 4*a*, second wiring 9 and external electrode pad 5 is preferably reduced. To reduce the pitch, it is preferable to use, as an ingredient, conductive paste or conductive ink that is at least partially made up of minute metal particles having a particle diameter of approximately 20 nm or less. The advantage of including such minute metal particles is the same as that described in the first exemplary embodiment.

Further, as in the first exemplary embodiment, first insulating resin 3 can be a material used in conventional passivation films, such as a polyimide, PBO or the like. First insulating resin 3 is, however, not limited to being this material. Further, second insulating resin 7 and third insulating resin 10 are preferably an epoxy-type resin, but are not limited to this. Any material may be used, provided that it is capable of suppressing ion migration occurring in the wiring as a result of the conducting members of the conductive resin, conductive ink and the like, and has favorable adhesiveness with respect to wiring and the substrate and excellent thermal resistance.

Further, although in FIG. 10 the external electrode pads have, for convenience, been given a simple arrangement, it goes without saying that the electrode pads are not limited to this arrangement and may take up a different arrangement, such as the one shown in FIG. 4.

Further, solder bumps can be formed on external electrode pad 5 via plating layer 6 as shown in FIG. 5. Although FIG. 5 shows an example in which the solder bumps are formed by solder balls, the solder bumps may be formed by using a solder paste printing.

Fourth Exemplary Embodiment

An LSI package of the exemplary embodiment includes a stress mitigating layer for reducing stresses in bumps. A structure of the LSI package of the exemplary embodiment is described below.

Figure 12:
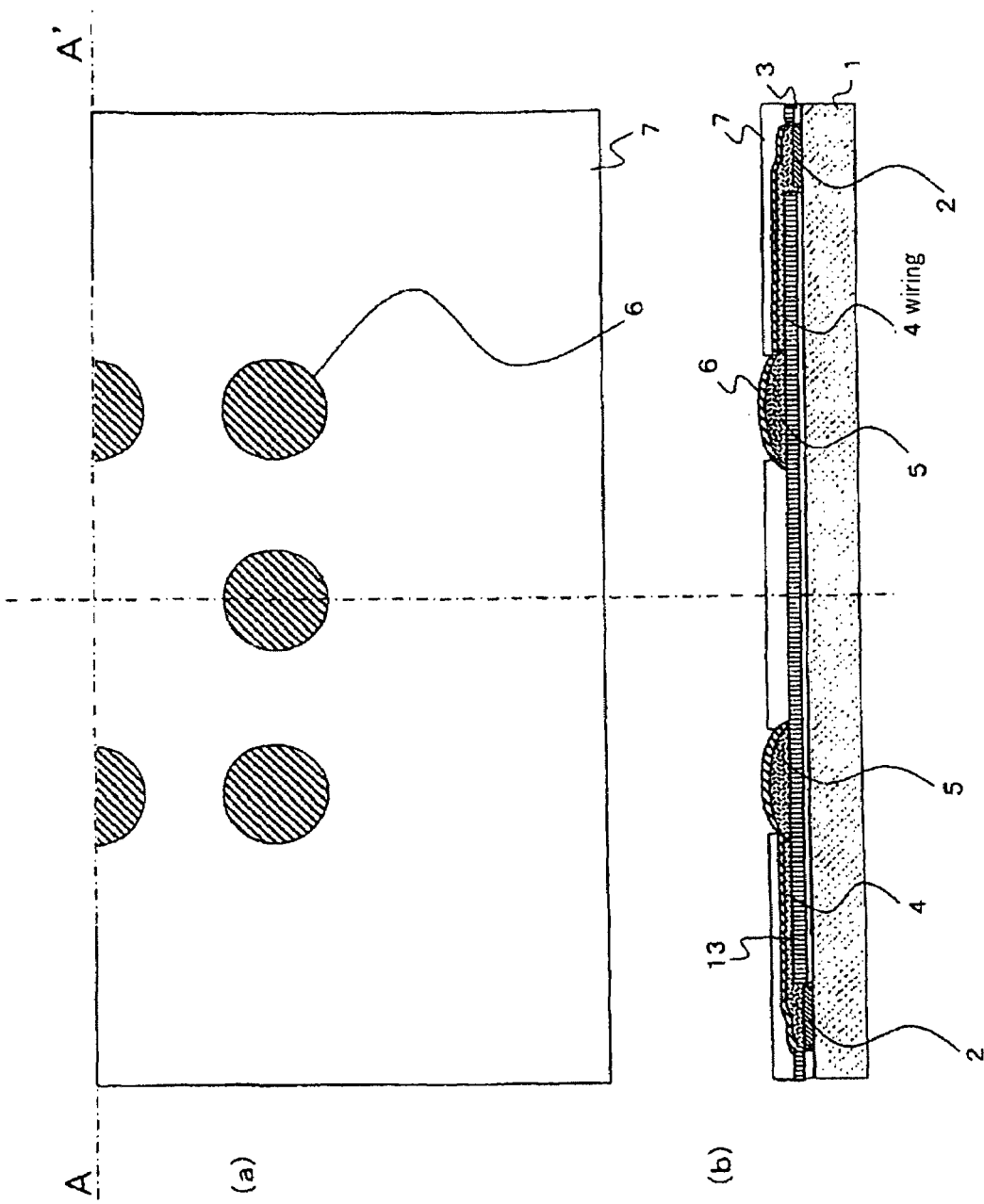
FIG. 12 is a top view and cross-sectional view schematically showing an LSI package according to a fourth exemplary embodiment.

FIG. 12 schematically shows an example of a basic structure of the LSI package of the exemplary embodiment. FIG. 12(*a*) is a top view, and FIG. 12(*b*) is a cross-sectional view taken along line AA' in FIG. 12(*a*).

As shown in FIG. 12, the LSI package includes, formed on a surface of LSI chip 1, LSI chip electrode pad 2, first insulating resin 3, wiring 4, external electrode pad 5, plating layer 6, second insulating resin 7 and stress mitigating layer 13.

First insulating resin 3 and LSI chip electrode pad 2 are formed in the same layer on the surface of LSI chip 1. Stress mitigating layer 13 is provided on first insulating resin 3. Wiring 4 and external electrode pad 5 which is connected to wiring 4 are provided on stress mitigating layer 13. Wiring 4 is connected to LSI chip electrode pad 2. Second insulating resin 7 is provided on stress mitigating layer 13.

Conducting members forming wiring 4 and external electrode pad 5 are made either of conductive resin or conductive ink. Upper surfaces of the conducting members are covered by plating layer 6. Plating layer 6 is coated by second insulating resin 7 except in a region extending from the center of external electrode pad 5 to a position near the periphery of external electrode pad 5. With this configuration, second insulating resin 7 covers a peripheral edge of external electrode pad 5.

In the structure of the exemplary embodiment, stress mitigating layer 13 is provided on first insulating resin 3. Consequently, when the package of the exemplary embodiment is mounted on a substrate board, stress in the solder bumps resulting from a difference in thermal expansion between the substrate board and silicon can be lowered.

As described above, the LSI package of the exemplary embodiment lowers stress in the solder bumps due to the stress mitigating layer, thereby preventing cracking and peeling of the external electrode pads and bringing about an improvement in reliability over the related art. Forming the electrode pads using a printing method not only allows a reduction in the load on the environment in comparison to lithographic techniques, but also lowers capital costs in comparison to lithographic techniques.

Note that in the LSI package of the exemplary embodiment, the stress mitigating layer is preferably a low elastic material. Although use of an elastomer or silicon rubber is desirable, a stress mitigating effect may be achieved by providing a gap between silicon and the substrate board on which the package is mounted through use of the insulating resin, conductive resin, or metal such as Cu. Further, by roughening a surface of the stress mitigating layer or using a material with a higher adhesion strength than first insulating resin with respect to the conducting members formed from conductive resin, conductive ink or the like, an improvement in adhesion strength can be achieved.

Further, the conducting members forming wiring 4 and external electrode pad 5 can, as in the first exemplary embodiment, be formed by using a sintered product of minute metal particles (minute metal particles of gold, silver, copper or the like), conductive resin or conductive ink (including an organic-inorganic composite with conductive particles dispersed therein), and the like. The exemplary embodiment resembles the first exemplary embodiment in that conductive paste or conductive ink that is at least partially made up of minute metal particles having a particle diameter of approximately 20 nm or less is preferably used as an ingredient.

The exemplary embodiment also resembles the first exemplary embodiment in that there are no limits on the materials used for the plating layer and insulating resins.

Further, as shown in FIG. 3, a structure may be used in which plating layer 6 is provided on external electrode pad 5 and at least a portion of the connected wiring, and the peripheral edge of plating layer 6 on external electrode pad 5 is covered by insulating resin. A further resemblance to the first exemplary embodiment is that resistance to ion migration can be improved by covering the entire wiring with plating layer 6.

The exemplary embodiment also resembles the second and third exemplary embodiments in that a pad arrangement differing to that of FIG. 12, such as the one shown in FIG. 4 may be used, in that a multilayer structure may be used, and in that solder bumps may be provided on plating layer 6 of external electrode 5. When the wiring has a multi-layer structure, stress mitigating layer 13 may be formed on any layer of the insulating resin except the uppermost layer.

Fifth Exemplary Embodiment

The LSI package of the exemplary embodiment includes a stress mitigating layer, but differs from the fourth exemplary embodiment. The structure of the LSI package of the exemplary embodiment is described below.

Figure 13:
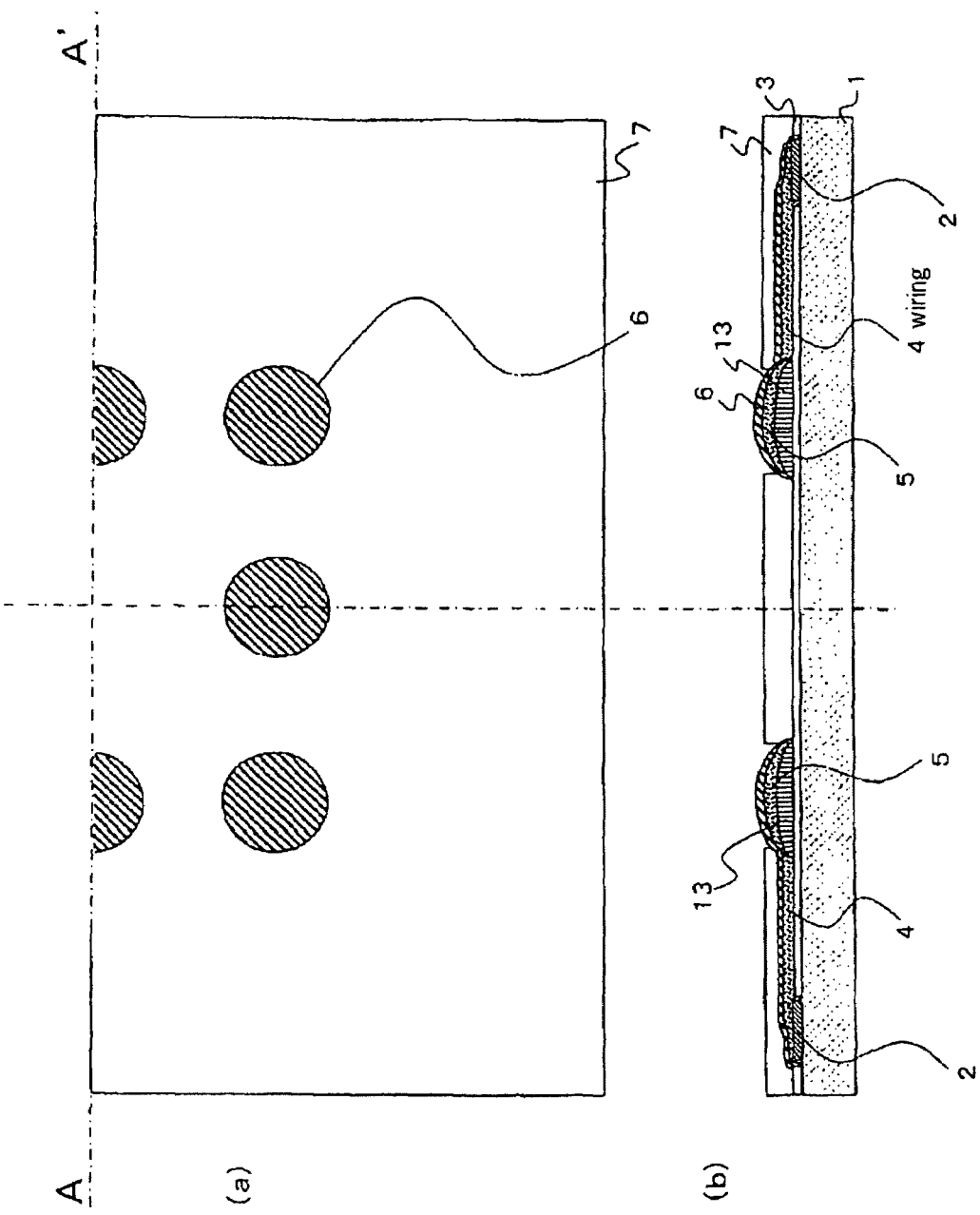
FIG. 13 is a top view and cross-sectional view schematically showing an LSI package according to a fifth exemplary embodiment.

FIG. 13 schematically shows an example of a basic structure of the LSI package of the exemplary embodiment. FIG. 13(*a*) is a top view, and FIG. 13(*b*) is a cross-sectional view taken along line AA' in FIG. 13(*a*).

As shown in FIG. 13, the LSI package includes, formed on a surface of LSI chip 1, LSI chip electrode pad 2, first insulating resin 3, wiring 4, external electrode pad 5, plating layer 6, second insulating resin 7 and stress mitigating layer 13.

First insulating resin 3 and LSI chip electrode pad 2 are formed in the same layer on the surface of LSI chip 1. Wiring 4 is provided on first insulating resin 3 and is connected to LSI chip electrode pad 2. Stress mitigating layer 13 is formed on first insulating resin 3 in a region where external electrode pad 5 is to be provided. External electrode pad 5 is formed on stress mitigating layer 13 and connected to wiring 4. Second insulating resin 7 is formed on first insulating resin 3 in regions outside regions corresponding to stress mitigating layer 13 and wiring 4.

Conducting members forming wiring 4 and external electrode pad 5 are constructed from conductive resin or conductive ink. Upper surfaces of the conducting members are covered by plating layer 6. Plating layer 6 is coated by second insulating resin 7 except in a region extending from the center of external electrode pad 5 to a region near the periphery of external electrode pad 5. With this configuration, second insulating resin 7 covers a peripheral edge of external electrode pad 5.

In the structure of the exemplary embodiment, stress mitigating layer 13 is provided on a bottom portion of external electrode pad 5. Consequently, when the package of the exemplary embodiment is mounted on a substrate board, stress in the solder bumps resulting from a difference in thermal expansion between the substrate board and silicon can be lowered.

As described above, the LSI package of the exemplary embodiment lowers stress in the solder bumps, thereby preventing cracking and peeling of the external electrode pads and bringing about an improvement in reliability over the related art. Further, since the stress mitigating layer is only provided at the external electrode pad portion, the gap to the substrate at secondary mounting is wider than in the fourth exemplary embodiment and a UF fill property can be improved. Further, forming the electrode pad using a printing method, not only allows a reduction in the load on the environment in comparison to lithographic techniques, but also lowers capital costs in comparison to lithographic techniques.

Note that in the LSI package of the exemplary embodiment, as in the fourth exemplary embodiment, the stress mitigating layer is preferably an elastic material. Although use of an elastomer or silicon rubber is desirable, a stress mitigating effect may be achieved by providing a gap between silicon and a substrate board on which the package is mounted through use of insulating resin, conductive resin, or metal such as Cu. Further, by roughening a surface of the stress mitigating layer or using a material with a higher adhesive strength than first insulating resin with respect to the conducting members formed from conductive resin, conductive ink or the like, an improvement in adhesive strength can be expected.

Further, the conducting members forming wiring 4 and external electrode pad. 5 can, as in the first exemplary embodiment, be formed by using a sinter product of minute metal particles (minute metal particles of gold, silver, copper or the like), conductive resin or conductive ink (including an organic-inorganic composite with conductive particles distributed therein) or the like. The exemplary embodiment also resembles the first exemplary embodiment in that conductive paste or conductive ink that is at least partially made up of minute metal particles having a particle diameter of approximately 20 nm or less is preferably used as an ingredient.

The exemplary embodiment further resembles the first exemplary embodiment in that there are no limits on the materials used for the plating layer and insulating resins.

Further, as shown in FIG. 3, a structure may be used in which plating layer 6 is provided on external electrode pad 5 and at least a portion of the wiring connected to external electrode 5, and the peripheral edge of plating layer 6 on external electrode pad 5 are covered by insulating resin. A further resemblance to the first exemplary embodiment is that resistance to ion migration can be improved by covering the entire wiring with plating layer 6.

The exemplary embodiment also resembles the second and third exemplary embodiments in that a pad arrangement differing to that of FIG. 12, such as the one shown in FIG. 4, may be used, in that a multilayer structure may be used, and in that a solder bump may be provided on plating layer 6 of external electrode 5.

As described in the first to fifth exemplary embodiments, with the LSI packages structure of the present invention, it is possible to provide a package that has high-reliability, low environmental impact and low cost, and allows multilayer wiring structures and high-density wiring.

Further, the LSI package of the present invention is not limited to being any of the first to fifth exemplary embodiments, and may be an appropriate combination thereof.

Sixth Exemplary Embodiment

The following describes a manufacturing method of the LSI package shown in FIG. 2.

The LSI package manufacturing method of the exemplary embodiment includes a preparation process for preparing a wafer (substrate) including LSI chips, a wiring process for supplying conductive resin or conductive ink by printing and subsequently curing the supplied conductive resin or conductive ink to form wiring and external electrode pads on the substrate, a plating process for forming a plating layer on at least a portion of the wiring and the external electrode pads, and an insulating resin forming process for forming insulating resin on the substrate so as to cover the plating layer on peripheral edges of the external electrode pads. Each of these processes is described in detail below.

FIG. 14 to FIG. 19 show the LSI package manufacturing processes according to the exemplary embodiment. For each figure, (a) is a top view and (b) is a cross-sectional view taken along line AA' of the top view.

Figure 14:
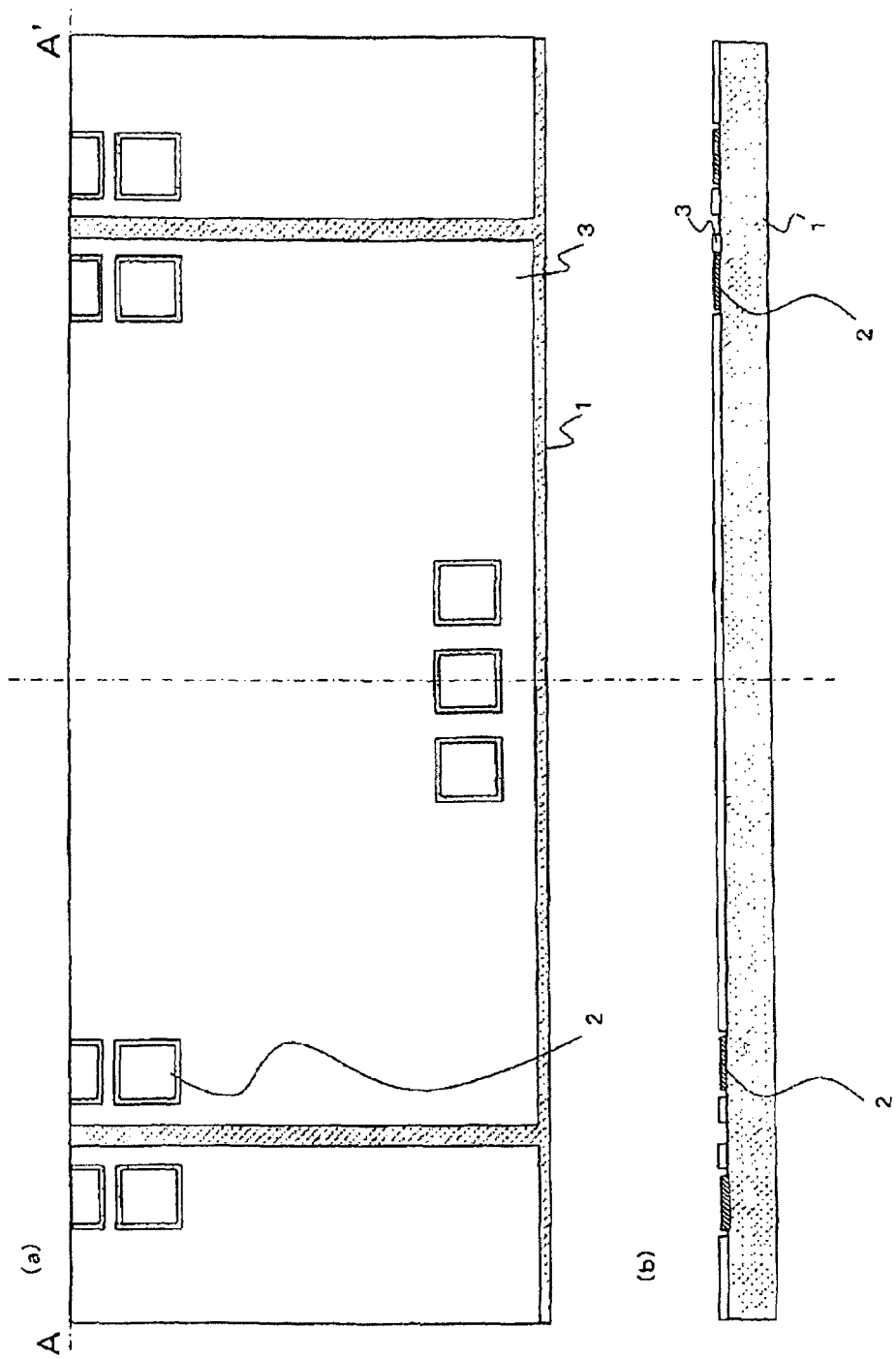
FIG. 14 is a top view and cross-sectional view schematically showing a manufacturing process for the LSI package shown in FIG. 2.

In the preparation process, first insulating resin 3, which includes an opening to expose an upper surface of LSI chip electrode pad 2, is formed on the wafer (substrate) that includes the LSI chip provided with LSI chip electrode pad 2 (FIG. 14). First insulating resin 3 is preferably a passivation film made either of a polyimide or PBO, but is not limited to this and may be any material on which wiring can be formed.

Figure 15:
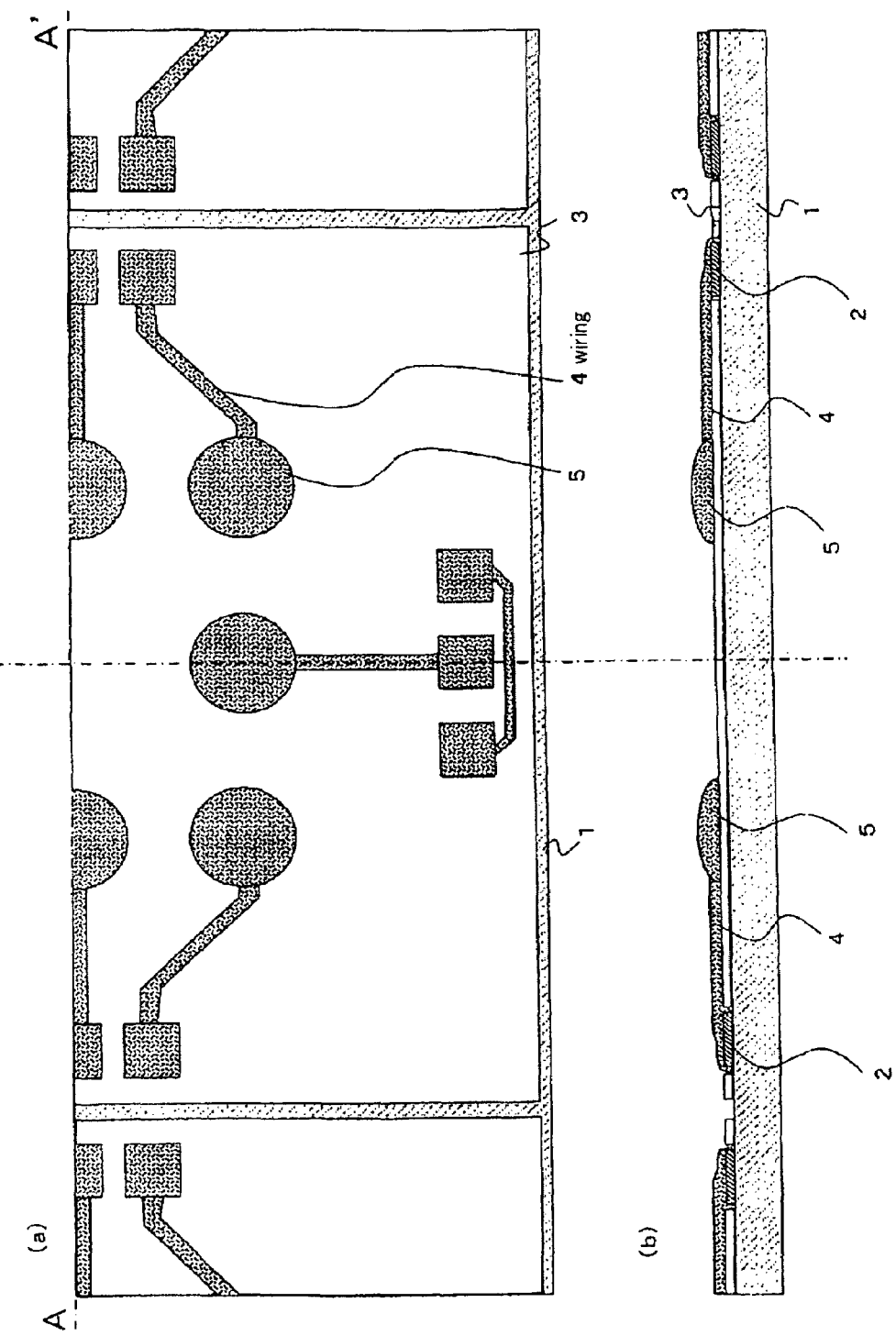
FIG. 15 is a top view and cross-sectional view schematically showing a manufacturing process for the LSI package shown in FIG. 2.

In the wiring process, conducting members for forming wiring 4 and external electrode pad 5 are provided on first insulating resin 3 and LSI chip electrode pad 2 using a printing method (FIG. 15).

The conducting members (wiring 4 and external electrode pad 5) are supplied by printing conductive resin (conductive paste) or conductive ink formed from a combination of resin and metal filler. The material used for the conductive paste or conductive ink is not limited, and may be any material having at least predetermined levels of desired properties such as conductivity, printability, curability and reliability.

External electrode pad 5 is a terminal for electrically connecting to the outside, and preferably has a larger area than LSI chip electrode pad 2 to facilitate soldering to a connection target such as a terminal of the substrate board. To prevent adjacent external electrode pads 5 from contact with the solder paste or the like, a pitch of external electrode pads 5 is preferably wider than a pitch of LSI chip electrode pads 2. Further, a dimension (wiring width) perpendicular to a longitudinal direction of wiring 4 that is connected to external electrode pad 5 is preferably no more than a width of an opening for chip electrode pad 2 in first insulating resin 3. This is to allow pitch reduction, which is described later.

In order to enable packages to be mounted with higher density, the pitch of each wiring portion is preferably narrowed. Moreover, it is preferable that resistance of the material which forms the wiring is simultaneously reduced. To achieve this reduction, it is preferable that conductive resin or conductive ink including minute metal particles having a particle diameter of approximately 20 nm or less and more preferably a particle diameter of 15 nm or less is used. Since metals have a property of fusing at low temperature when particle size is reduced to a few tens of nm or less, reducing the particle size of the filler can improve printability as well as contributing to improving conductivity.

For forming the wiring portions, there is no limit on application method and any method capable of forming a predetermined pattern can be used. The predetermined pattern can be applied using a printing method that employs a mask, an inkjet method, a dispense method, or the like. Through curing, the applied conductive resin or conductive ink is caused to electrically conduct and function as wiring.

Figure 16:
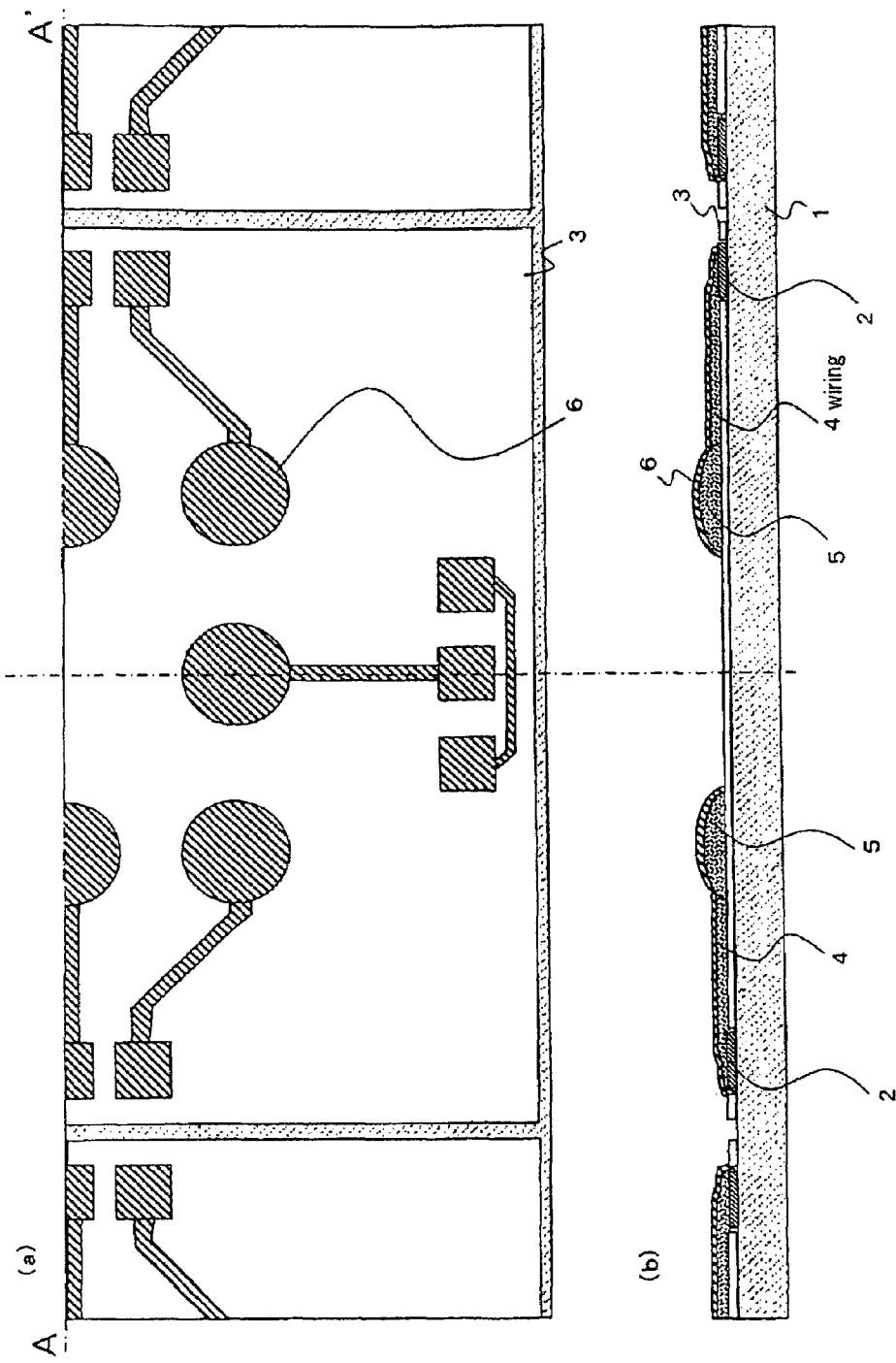
FIG. 16 is a top view and cross-sectional view schematically showing a manufacturing process for the LSI package shown in FIG. 2.

In the plating process, plating layer 6 is formed on all upper surfaces of the conducting members to produce a state in which soldering is possible (FIG. 16). Although the material used for the plating is not limited and can be any material which has favorable electrical characteristics and allows soldering, the material is preferably Cu, Ni, Ni/Au, Ni/Pd/Au or the like. Note that after forming plating layer 6, the surface thereof is preferably roughened by performing mechanical or chemical grinding processing, blast processing, plasma processing, chemical processing, or the like. Roughening of the surface improves adhesiveness with respect to the insulating resin formed thereafter.

Figure 17:
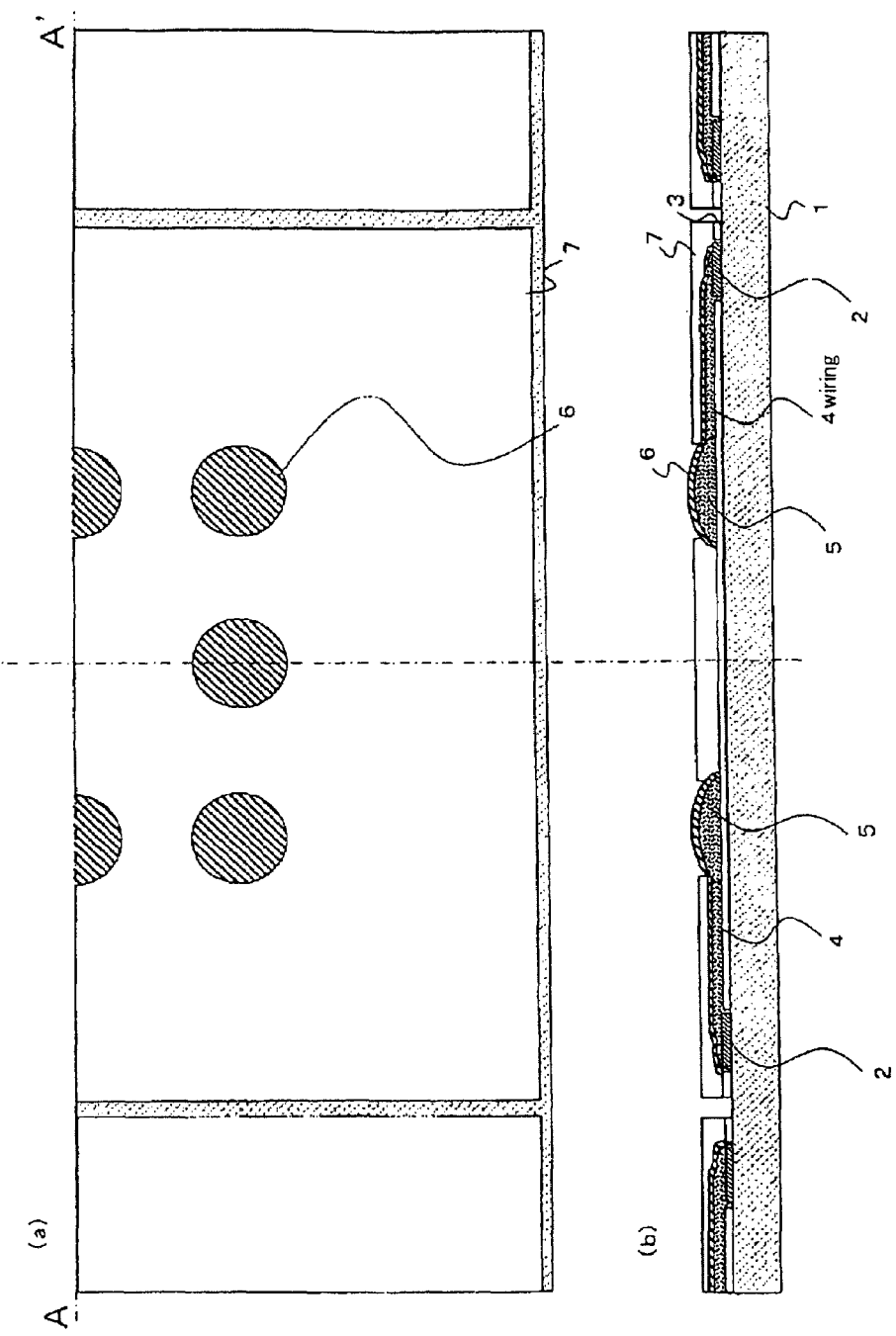
FIG. 17 is a top view and cross-sectional view schematically showing a manufacturing process for the LSI package shown in FIG. 2.

In the insulating resin forming process, second insulating resin 7 is formed on first insulating resin 3 so as to cover plating layer 6 on a peripheral edge of external electrode pad 5 (FIG. 17). The material used to form second insulating resin 7 is preferably an epoxy resin but is not limited to this, and may be any material having a high adhesive strength with respect to the wiring and the substrate and a desired heat-resistance, and being capable of suppressing wiring migration. Moreover, there is no limit on the method used for application. Application using a printing method employing a screen mask or an inkjet method is preferable, but use of method in which a photosensitive resin is applied using a spin coater or a laminator is also acceptable.

Figure 18:
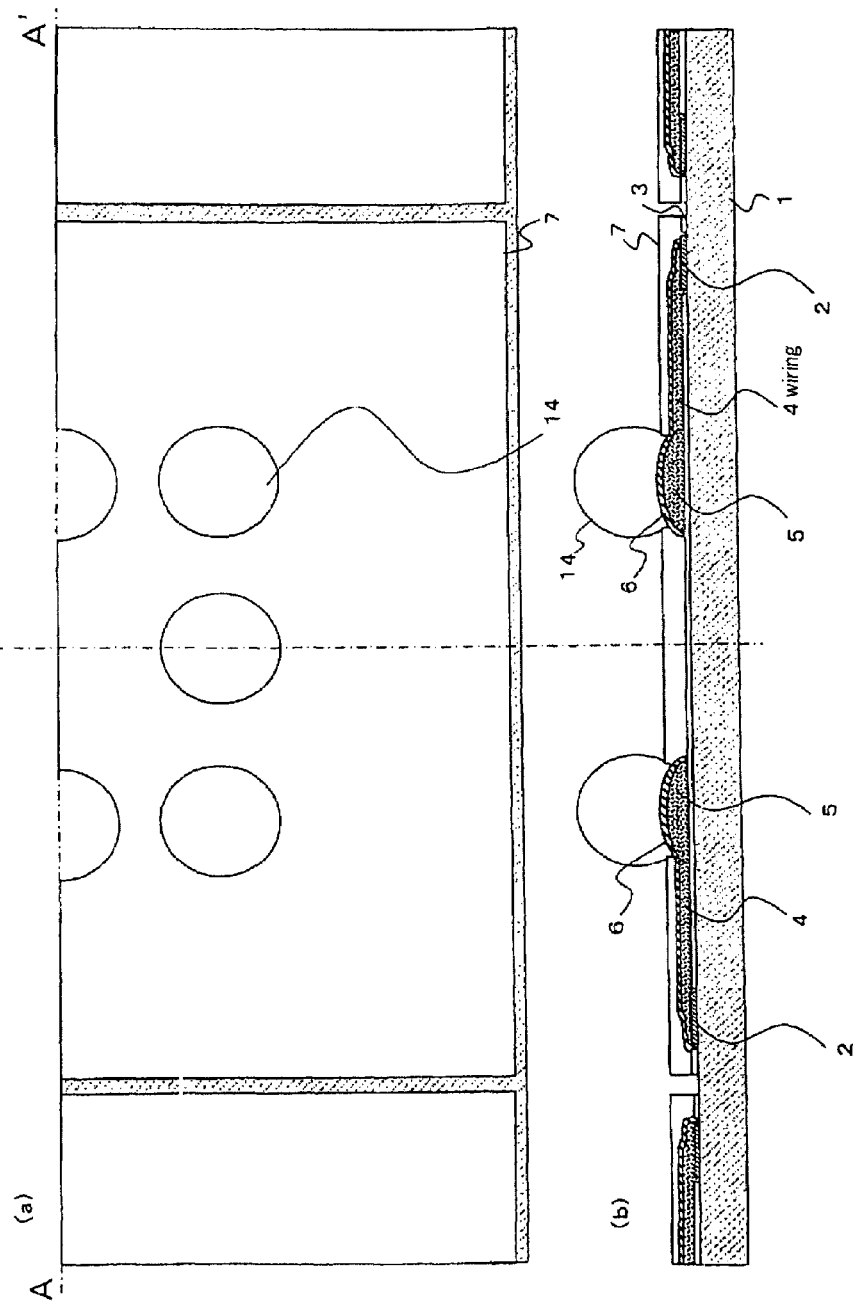
FIG. 18 is a top view and cross-sectional view schematically showing a manufacturing process for the LSI package shown in FIG. 2.

Thereafter, solder bumps 14 may be formed on external electrode pads 5 according to product requirements (FIG. 18). A conventionally performed method may be used to form the solder bumps. Such methods include a method of printing a solder paste and subsequently applying heat, and a method of printing flux, subsequently adding solder balls and applying heat. However, there are no particular limits to the method employed.

Figure 19:
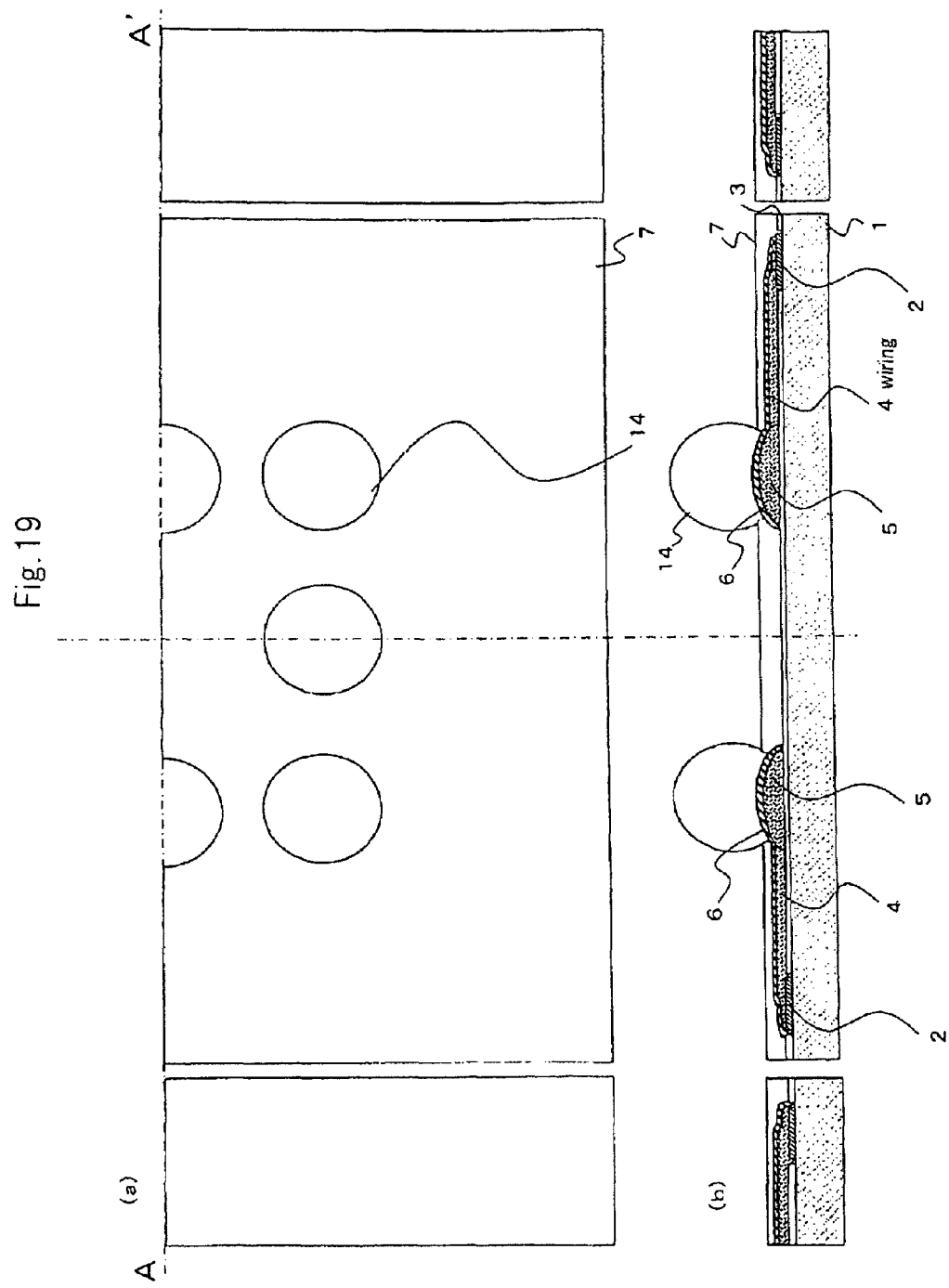
FIG. 19 is a top view and cross-sectional view schematically showing a manufacturing process for the LSI package shown in FIG. 2.

When each of the above-described processes is to be performed with the LSI chips 1 remaining in wafer state, a dicing process is required as a final process to divide the wafers into separate LSI chips 1 (FIG. 19). For the dicing process, a conventional method may be used.

According to the above-described LSI package manufacturing method, it is possible to provide a package of high reliability, low environmental impact, and low cost.

In the LSI package manufacturing method of the exemplary embodiment, a wiring forming method that is cheap and has a low environmental impact due to the use of conductive resin that does not produce the waste material or etching effluent associated with photolithographic methods is used, and a highly reliable package can be provided.

Seventh Exemplary Embodiment

The following describes a manufacturing method of the LSI package shown in FIG. 3.

The package manufacturing method of the exemplary embodiment includes a preparation process for preparing a wafer (substrate) including LSI chips, a wiring process for supplying conductive resin or conductive ink by printing and subsequently curing the supplied conductive resin or conductive ink to form wiring and external electrode pads on the substrate, a plating process for forming a plating layer on at least a portion of the wiring and the external electrode pads, and an insulating resin forming process for forming insulating resin so as to cover the plating layer on peripheral edges of the external electrode pads. Each of these processes is described in detail below.

FIG. 20 to FIG. 23 show an LSI package manufacturing processes according to the exemplary embodiment. For each figure, (a) is a top view and (b) is a cross-sectional view taken along line AA' of the top view.

Figure 20:
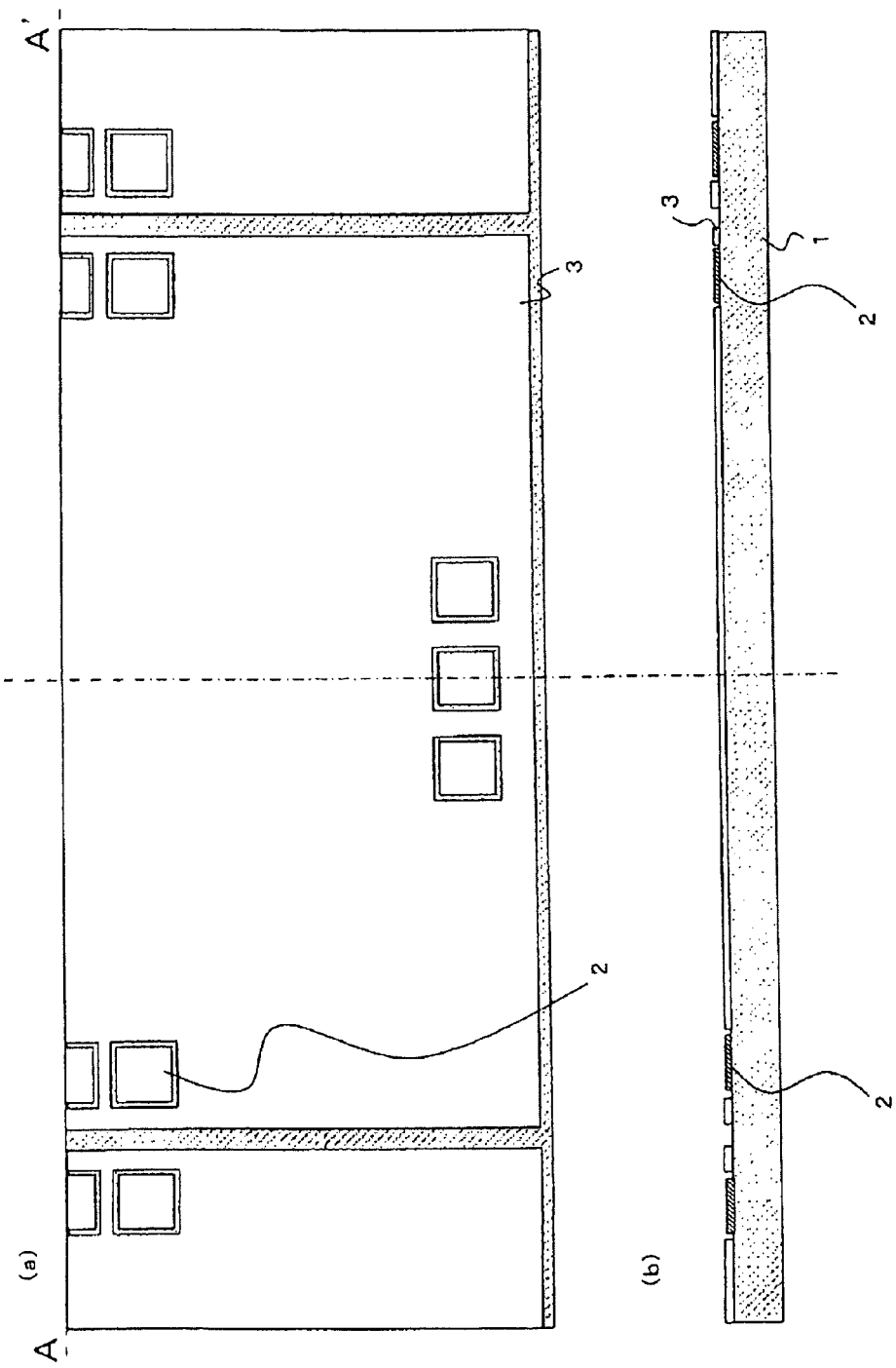
FIG. 20 is a top view and cross-sectional view schematically showing a manufacturing process for the LSI package shown in FIG. 3.

In the preparation process, first insulating resin 3 is formed on the LSI chips (wafer) having LSI chip electrode pads 2, so as to include LSI chip electrode pads 2 in openings (FIG. 20). First insulating resin 3 is preferably a passivation film made either of a polyimide or PBO, but may be any material on which wiring can be formed.

Figure 21:
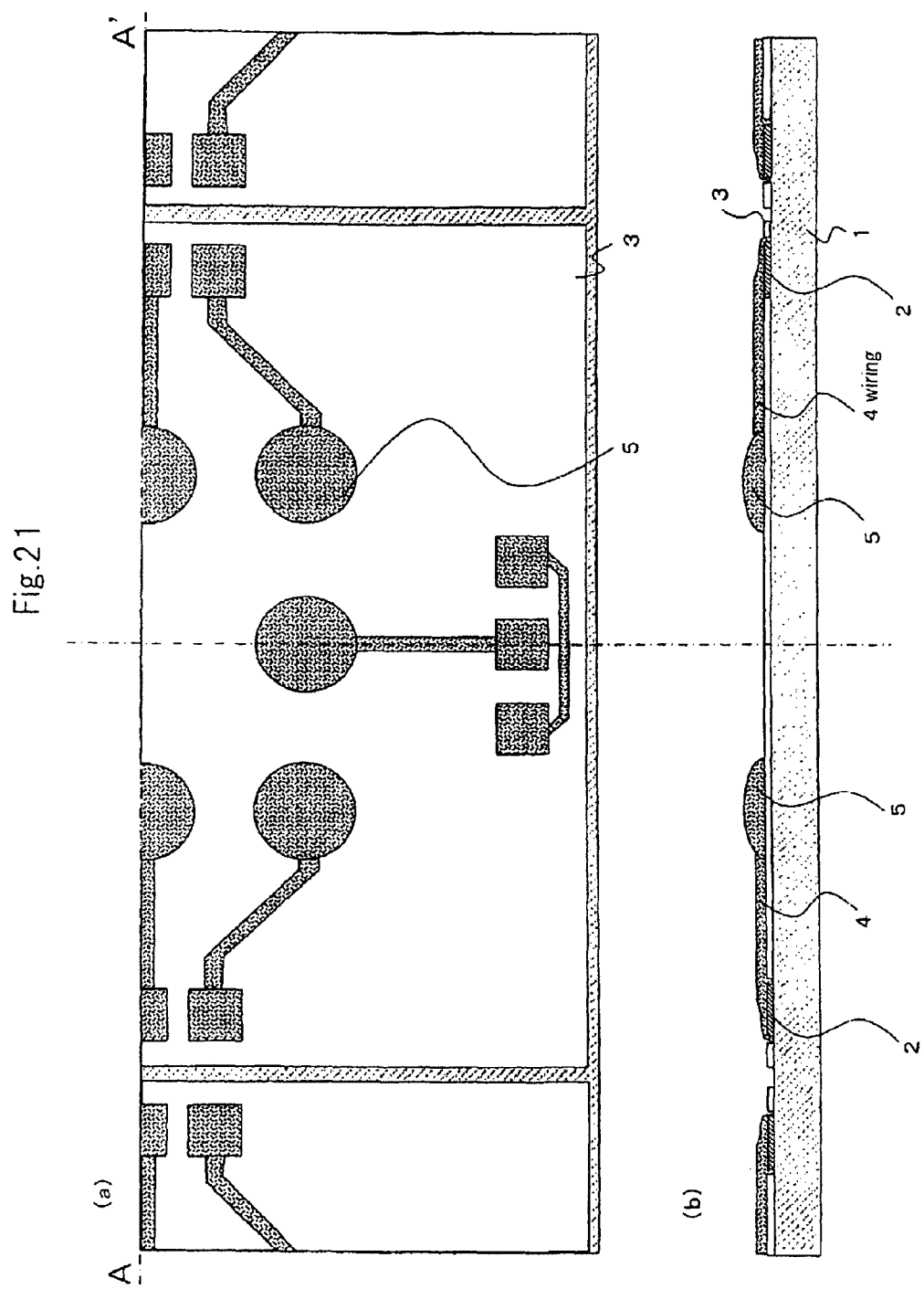
FIG. 21 is a top view and cross-sectional view schematically showing a manufacturing process for the LSI package shown in FIG. 3.

In the wiring process, materials for forming wiring 4 and electrode pad 5 are provided (FIG. 21). The conducting members (wiring 4 and external electrode pad 5) are supplied by printing conductive resin (conductive paste) or conductive ink formed from a combination of resin and metal filler. The material used for the conductive paste or conductive ink is not limited, and may be any material having the desired properties of conductivity, printability, curability, reliability and the like. In order to enable packages to be mounted with higher density, the pitch of each wiring portion is preferably narrowed.

Further, it is preferable that the resistance of the material which forms the wiring is simultaneously reduced. To achieve the reduction, it is preferable to use conductive resin or conductive ink including minute metal particles having a particle diameter of approximately 20 nm or less and preferably a particle diameter of 15 nm or less. Since metals have a property of fusing at low temperature when particle size is reduced to a few tens of nm or less, reducing the particle size of the filler can improve printability as well as contributing to improving conductivity.

The application method used to form the wiring is not limited and may be any method which is capable of forming a predetermined pattern. For instance, a printing method employing a mask, and ink jet method, or dispense method may be used. Through curing, the applied conductive resin or conductive ink is caused to electrically conduct and function as wiring.

Figure 22:
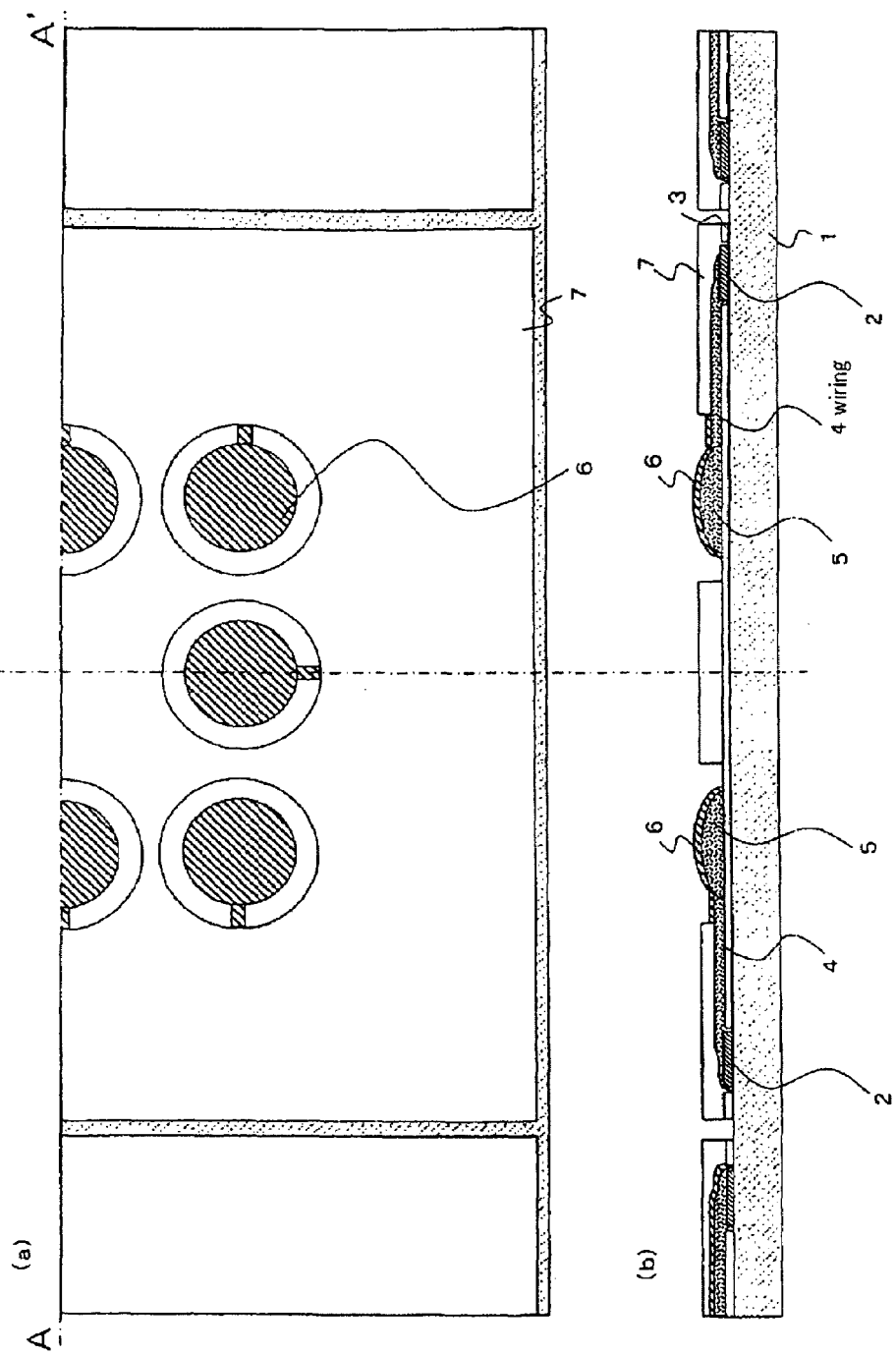
FIG. 22 is a top view and cross-sectional view schematically showing a manufacturing process for the LSI package shown in FIG. 3.

In the plating process of the exemplary embodiment, an insulating resin forming process is added before the plating process. To protecting wiring 4, the surface thereof is covered by insulating resin 7. At this time, the insulating resin is formed in such as way as to ensure that an opening in second insulating resin 7 is larger than external electrode pad 5. Thereafter, plating layer 6 is formed on all upper surfaces of the conducting members which exist in the open portion in the insulating resin to produce a state in which soldering is possible (FIG. 22). Although the material used for the plating is not limited and can be any material which has favorable electrical characteristics and allows soldering, the material is preferably Cu, Ni, Ni/Au, Ni/Pd/Au or the like. Note that after forming plating layer 6, the surface thereof is preferably roughened by performing mechanical or chemical grinding processing, blast processing, plasma processing, chemical processing, or the like. Roughening of the surface improves adhesiveness with respect to insulating resin formed thereafter.

Figure 23:
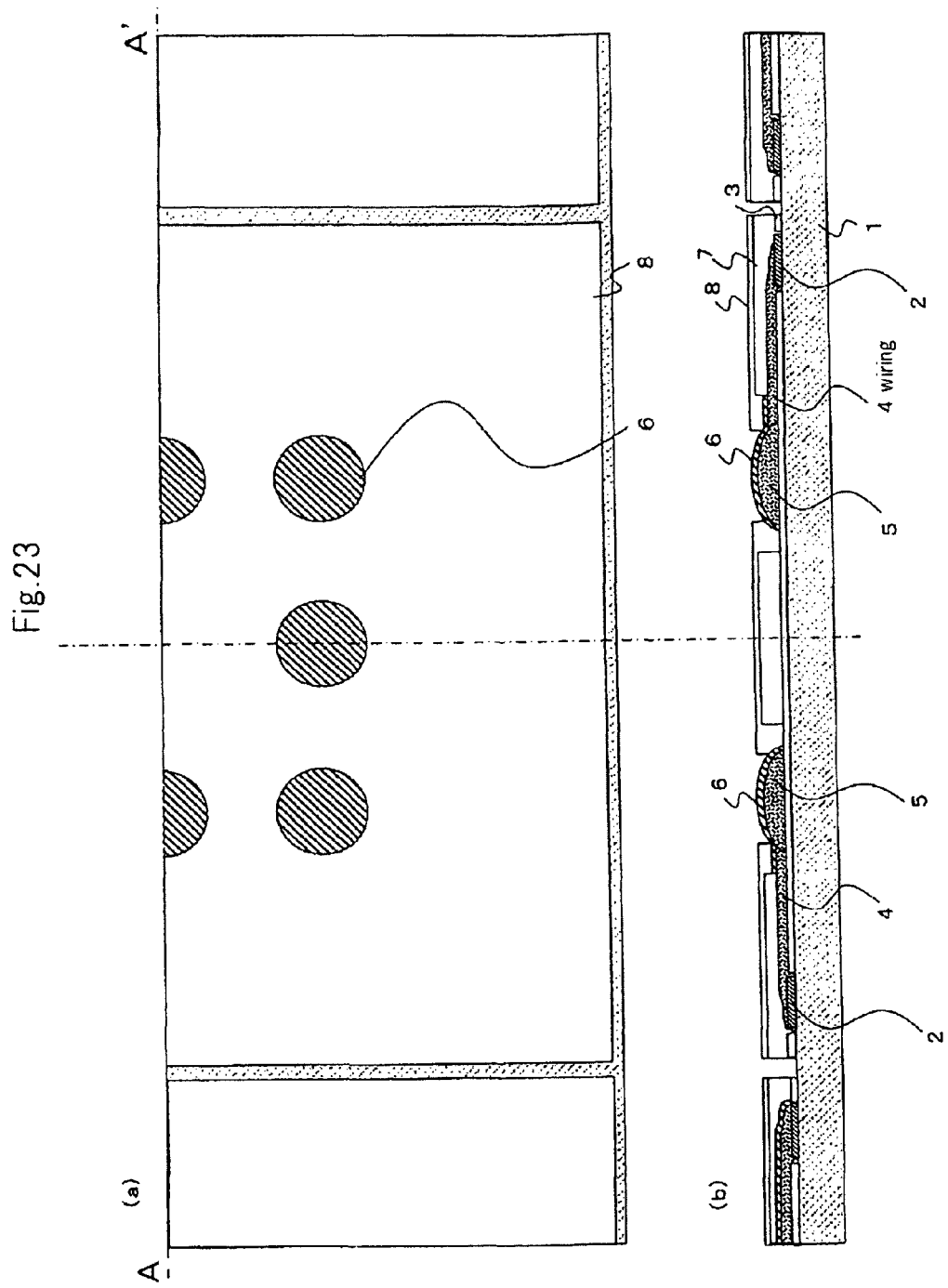
FIG. 23 is a top view and cross-sectional view schematically showing a manufacturing process for the LSI package shown in FIG. 3.

In the insulating resin forming process, third insulating resin 8 is formed so as to cover a peripheral edge of plating layer 6 formed on external electrode pad 5 (FIG. 23). Third insulating resin 8 is preferably an epoxy-type resin, but is not limited to this. Any material may be used, provided that it has favorable adhesiveness with respect to the wiring and the underlayer and desired heat resistance, and is capable of suppressing migration of the wiring. Moreover, there is no limit on the method to used apply insulating resin 8. A printing method employing a screen mask or an inkjet method is preferable, but use of method in which a photosensitive resin is applied using a spin coater or a laminator is also acceptable.

Thereafter, solder bumps 14 may be formed on external electrode pads 5 according to product requirements in the same way as in the sixth exemplary embodiment. Further, as in the sixth exemplary embodiment, when the above-described processes are implemented with LSI chips 1 in wafer state, a dicing process is required as a final process.

According to the above-described LSI package manufacturing method, it is possible to provide a package of high reliability, low environmental impact, and low cost.

Eighth Exemplary Embodiment

The following describes a manufacturing method of the LSI package shown in FIG. 9.

The package manufacturing method of the exemplary embodiment includes a preparation process for preparing a wafer (substrate) including LSI chips, a first wiring process for supplying conductive resin or conductive ink by printing and subsequently curing the supplied conductive resin or conductive ink to form wiring and external electrode pads on the substrate, a process for forming an insulating resin layer to cover the first wiring, a second wiring process for forming a second wiring layer by a similar method to the first wiring process, a plating process for forming a plating layer on at least a portion of the wiring and the external electrode pads, and a process for forming a second insulating resin so as to cover the plating layer on peripheral edges of the external electrode pads.

FIG. 24 to FIG. 27 show processes of the LSI package manufacturing method according to the exemplary embodiment. For each figure, (a) is a top view and (b) is a cross-sectional view taken along line AA' of the top view.

Figure 24:
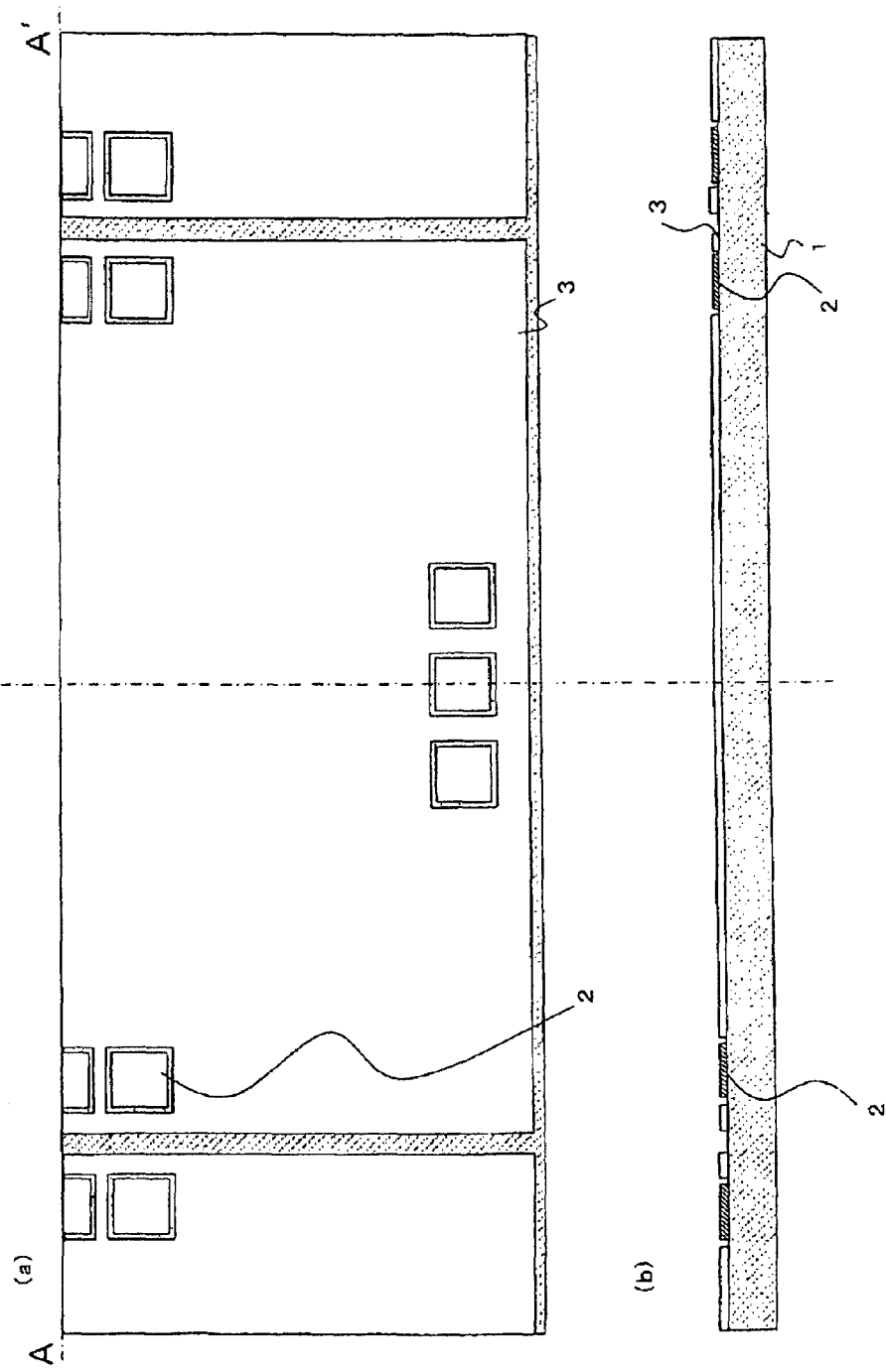
FIG. 24 is a top view and cross-sectional view schematically showing a manufacturing process for the LSI package shown in FIG. 9.

In the preparation process, first insulating resin 3 is formed on the LSI chip (wafer) having LSI chip electrode pad 2 so as to include LSI chip electrode pad 2 in an opening (FIG. 24). First insulating resin 3 is preferably a passivation film made either of a polyimide or PBO, but may be any material on which wiring can be formed.

In the first wiring process, material for forming first wiring 4a and external electrode pad 5 is supplied. The conducting members (first wiring 4a and external electrode pad 5) are supplied by printing conductive resin or conductive ink in the same way as in the seventh exemplary embodiment. There is no limit on the material of the conductive paste or conductive ink. It is preferable to use conductive resin or conductive ink including minute metal particles having a particle diameter of approximately 20 nm or less and preferably a particle diameter of 15 nm or less. As in the seventh exemplary embodiment, there is no limit on the method used for application. Through curing, the applied conductive resin or conductive ink is caused to electrically conduct and function as wiring.

Figure 25:
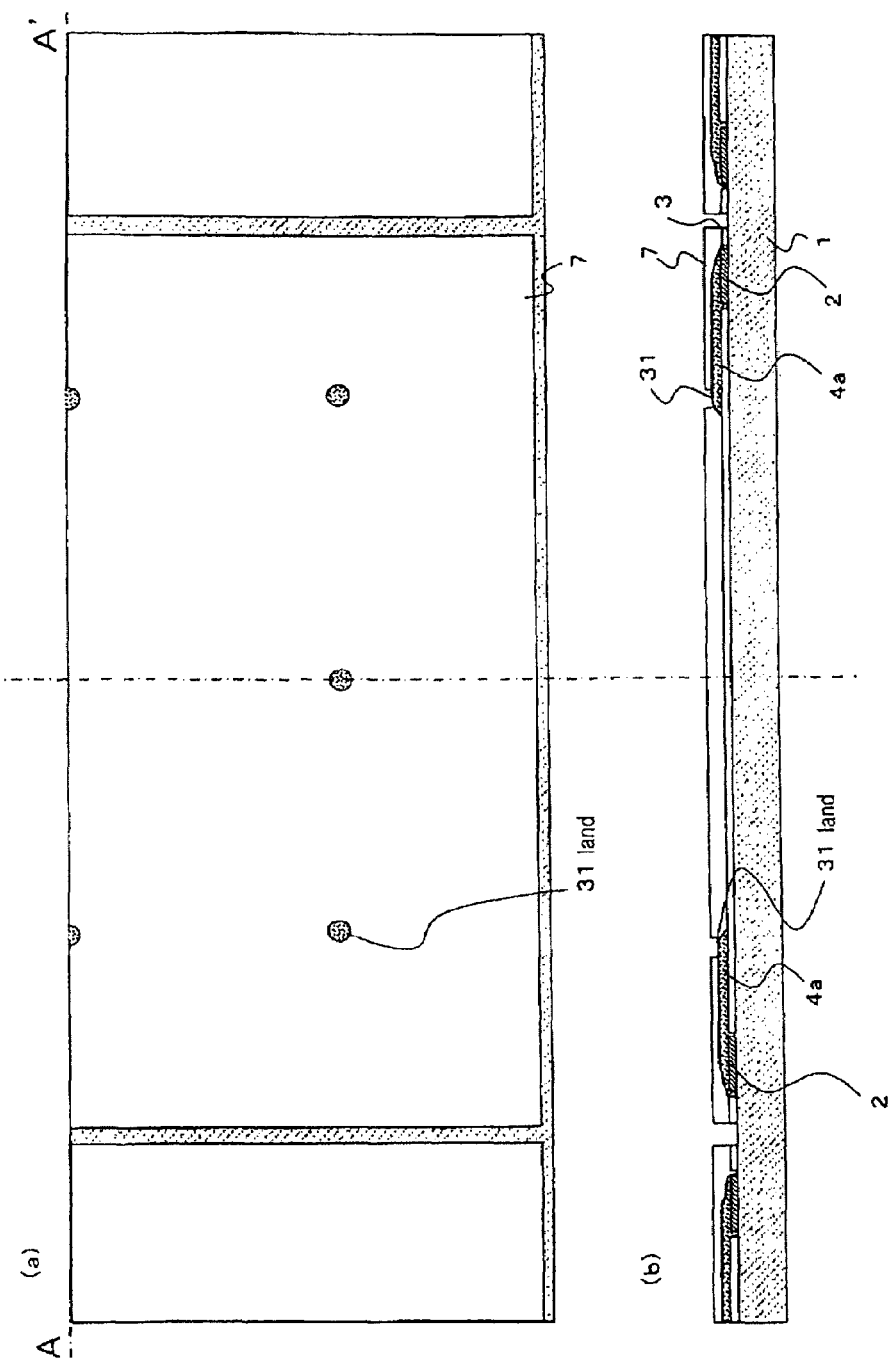
FIG. 25 is a top view and cross-sectional view schematically showing a manufacturing process for the LSI package shown in FIG. 9.

Thereafter, second insulating layer 7, which is to become an underlayer of second wiring 9, is formed. At this time, second insulating layer 7 is formed so as to leave only uncovered land 31, which is for a connection portion between first wiring 4a and second wiring 9 (FIG. 25).

In the second wiring process, an electrical connection between first wiring 4a and second wiring 9 can be made by forming second wiring 9 on land 31. Land 31 is provided in the opening portion of second insulating resin 7 by a process that precedes formation of second wiring 9 on second insulating resin 7 and makes use of the same method as was used to form the first wiring.

Figure 26:
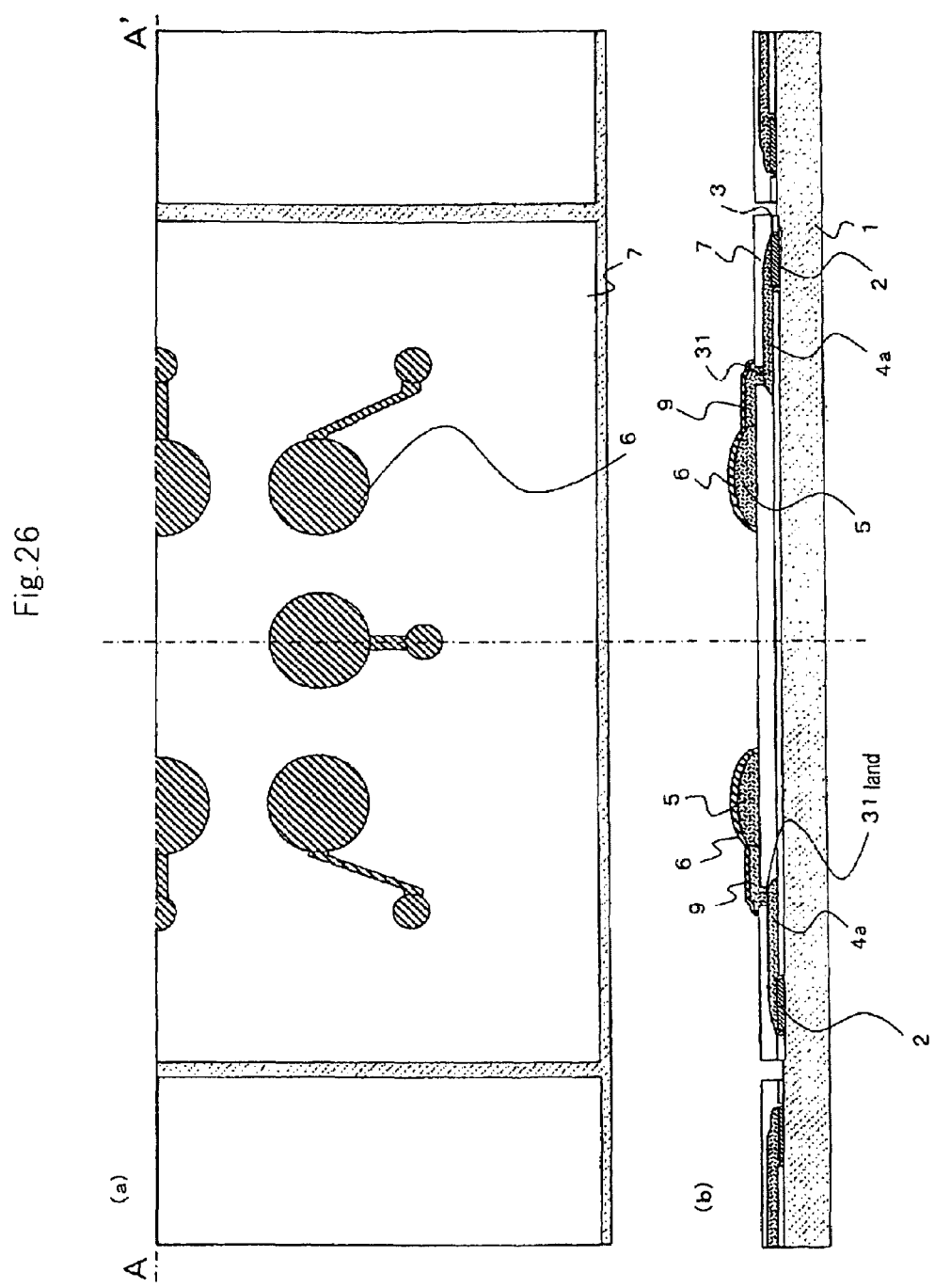
FIG. 26 is a top view and cross-sectional view schematically showing a manufacturing process for the LSI package shown in FIG. 9.

In the plating process, plating layer 6 is formed on all upper surfaces of the conducting members in the same way as the sixth exemplary embodiment to produce a state in which soldering is possible (FIG. 26). Although the material used for the plating is not limited and can be any material which has favorable electrical characteristics and allows soldering, the material is preferably Cu, Ni, Ni/Au, Ni/Pd/Au or the like. Note that after forming plating layer 6, the surface thereof may be roughened by performing mechanical or chemical grinding processing, blast processing, plasma processing, chemical processing, or the like. Roughening of the surface improves adhesiveness with respect to insulating resin formed thereafter.

Figure 27:
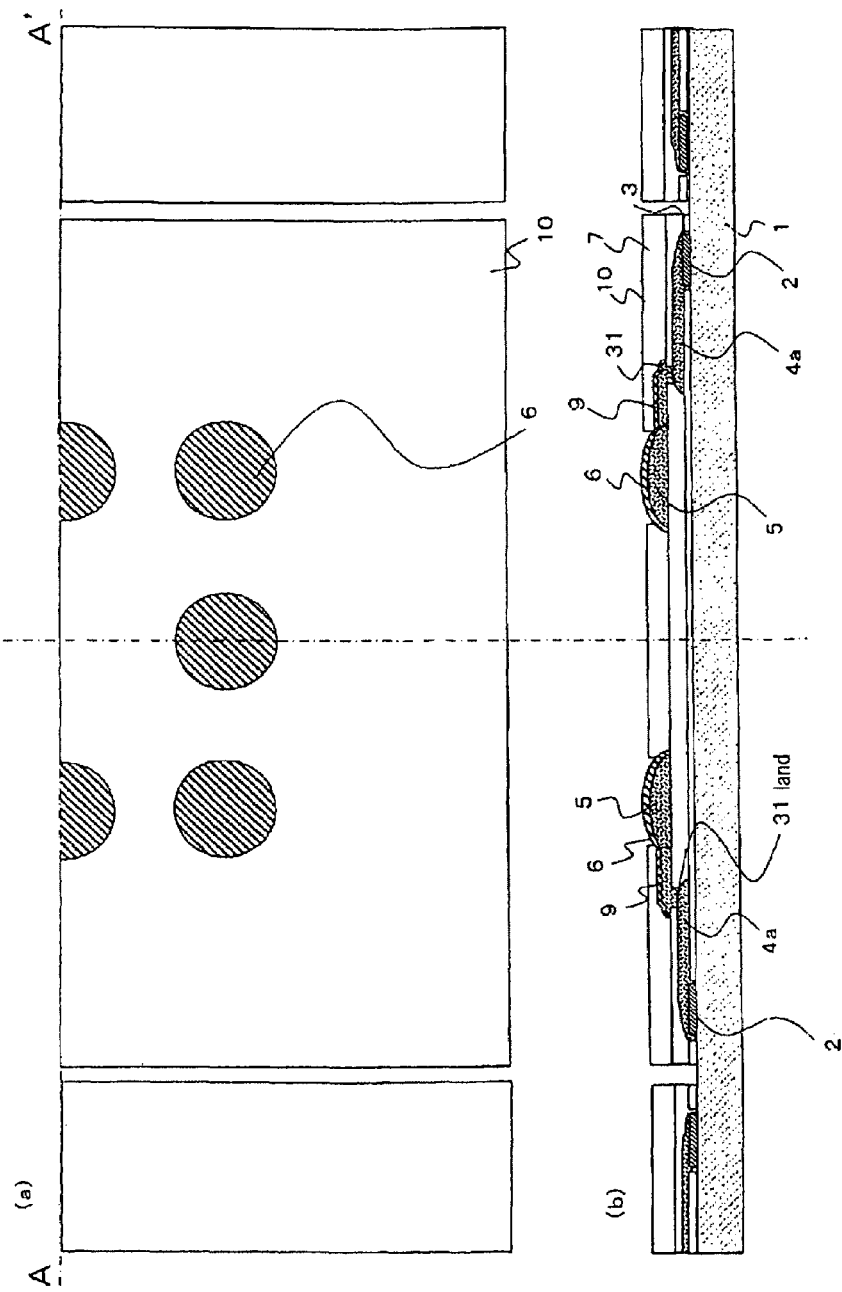
FIG. 27 is a top view and cross-sectional view schematically showing a manufacturing process for the LSI package shown in FIG. 9.

In the insulating resin forming process, third insulating resin 10 is formed so as to cover the peripheral edge of plating layer 6 formed on the external electrode pads (FIG. 27). Third insulating resin 10 is not limited to being a particular material. As in the sixth and seventh exemplary embodiments, any material may be used, provided that it has high adhesiveness with respect to the wiring and the underlayer and a desired heat resistance, and is capable of suppressing migration of the wiring. Moreover, there is no limit on the method used for the application of third insulating resin 10.

Thereafter, solder bumps may be formed on external electrode pads according to product requirements in the same way as in the sixth and seventh exemplary embodiments. Further, the exemplary embodiment also resembles the sixth and seventh exemplary embodiments in that when the above-described processes are implemented on LSI chips 1 in wafer state, a dicing process is required as a final process.

Note that although, in the exemplary embodiment, a two-layer wiring structure was described, it is possible to achieve a multilayer structure by repeating a process resembling the first wiring process and second wiring process a desired number of times.

According to the above-described LSI package manufacturing method, it is possible to provide a package that has high reliability, low environmental impact and low cost, and allows high-density wiring to be formed.

Ninth Exemplary Embodiment

The following describes a manufacturing method of the LSI package shown in FIG. 12.

The package manufacturing method of the exemplary embodiment includes a preparation process for preparing a wafer (substrate) including LSI chips, a process for providing a stress mitigating layer on an insulating resin on the LSI chips, a first wiring process for supplying conductive resin or conductive ink by printing and subsequently curing the supplied conductive resin or conductive ink to form wiring and external electrode pads, a plating process for forming a plating layer on the external electrode pads and at least a portion of the wiring, and a process for forming a second insulating resin on the plating layer so as to cover peripheral edges of the external electrode pads.

FIG. 28 to FIG. 31 show the LSI package manufacturing processes according to the exemplary embodiment. For each figure, (a) is a top view and (b) is a cross-sectional view taken along line AA' of the top view.

Figure 28:
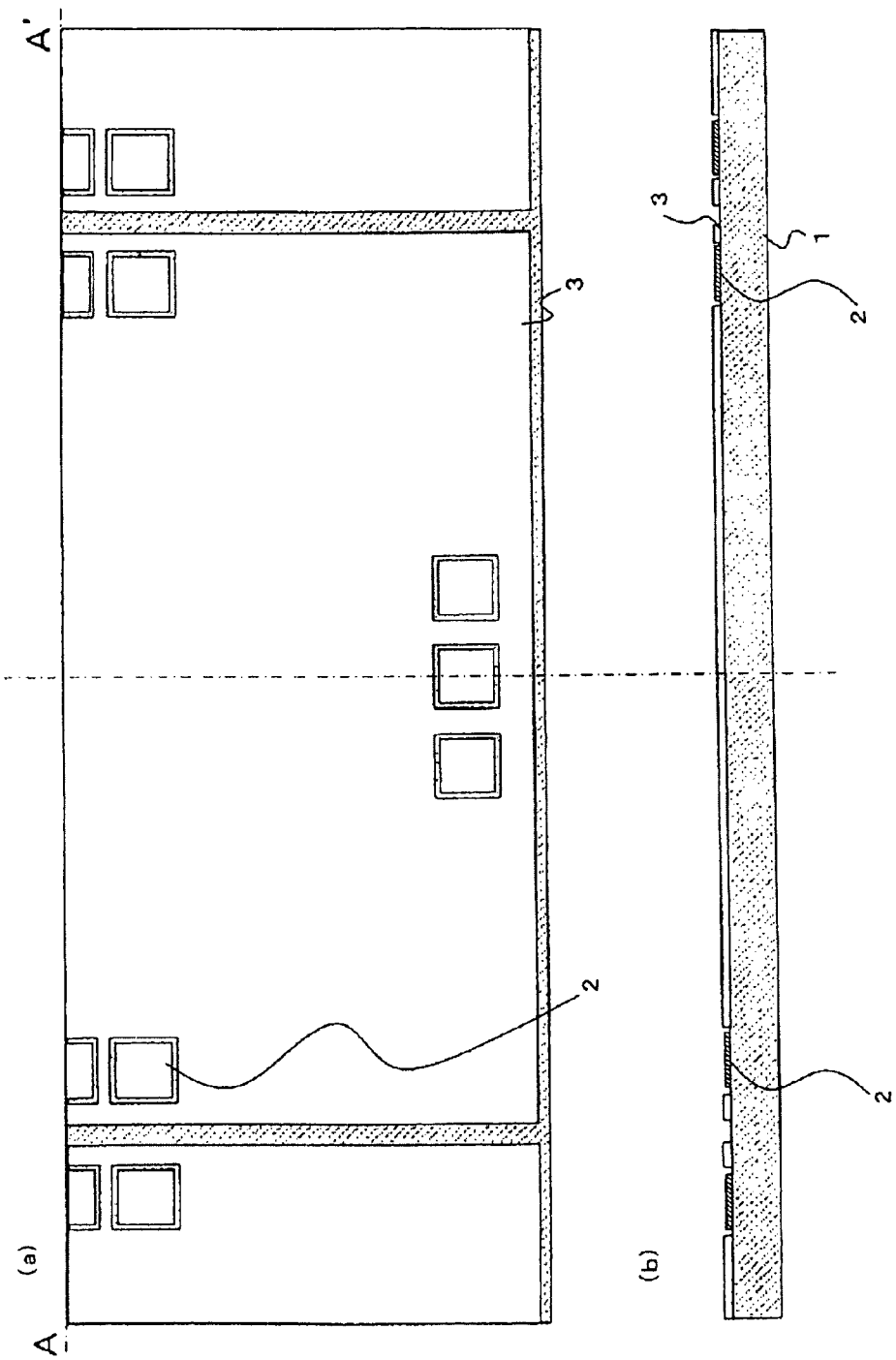
FIG. 28 is a top view and cross-sectional view schematically showing a manufacturing process for the LSI package shown in FIG. 12.

In the preparation process, first insulating resin 3 is formed on the wafer (substrate) including LSI chips which have LSI chip electrode pads 2, so as to include LSI chip electrode pads 2 in openings (FIG. 28). First insulating resin 3 is preferably a passivation film made either of a polyimide or PBO, but may be any material on which wiring can be formed.

Figure 29:
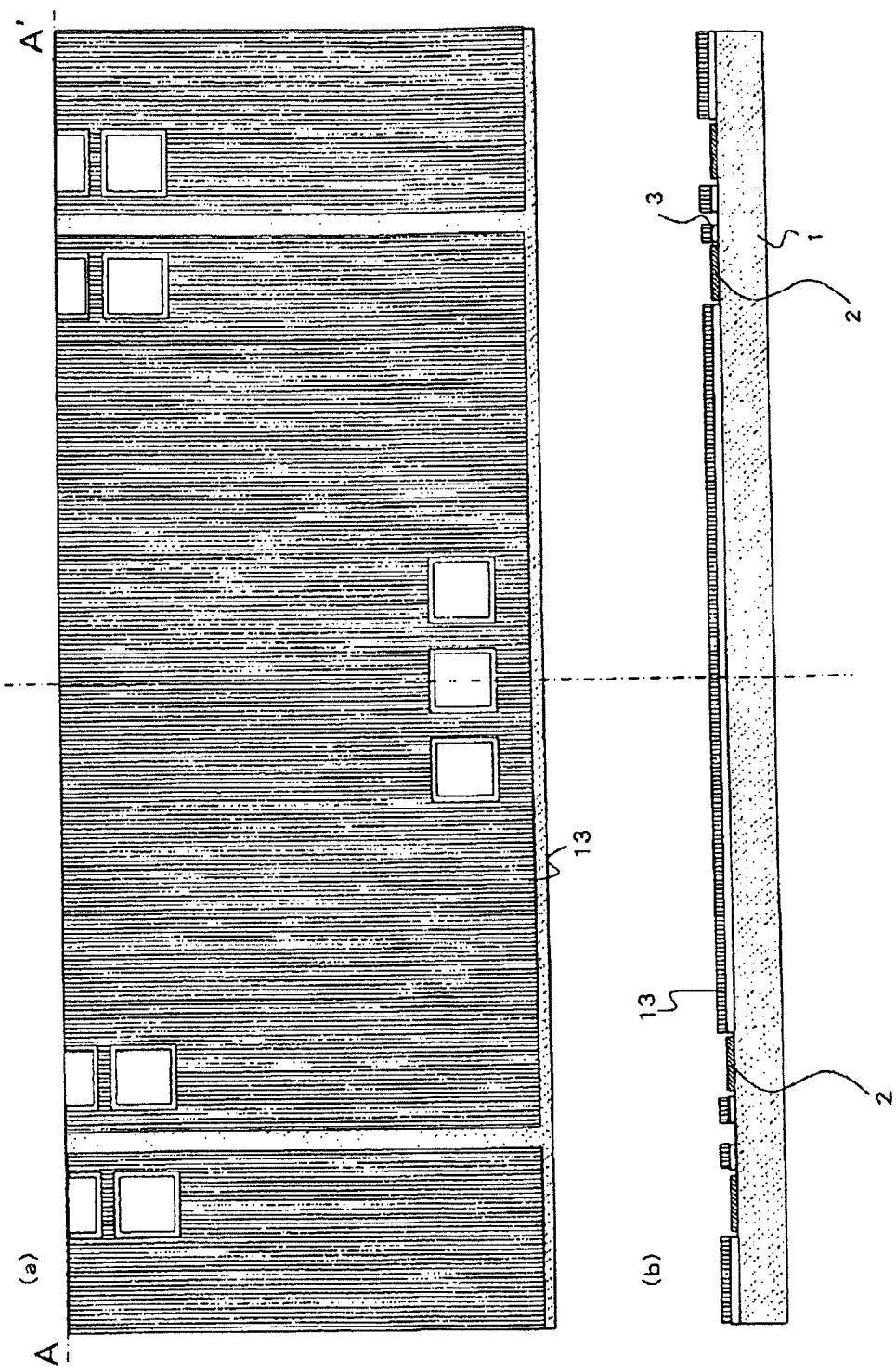
FIG. 29 is a top view and cross-sectional view schematically showing a manufacturing process for the LSI package shown in FIG. 12.
Figure 30:
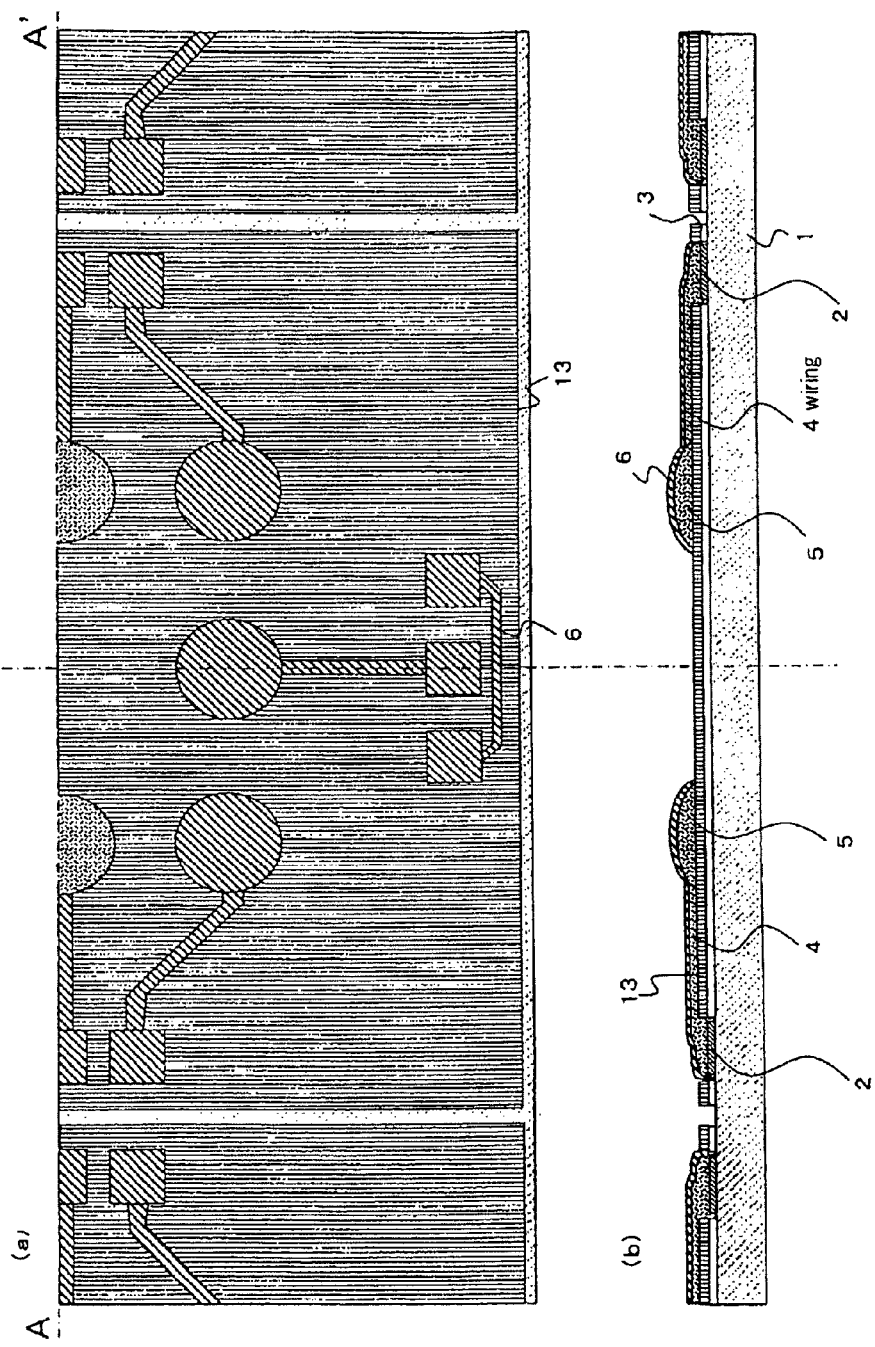
FIG. 30 is a top view and cross-sectional view schematically showing a manufacturing process for the LSI package shown in FIG. 12.
Figure 31:
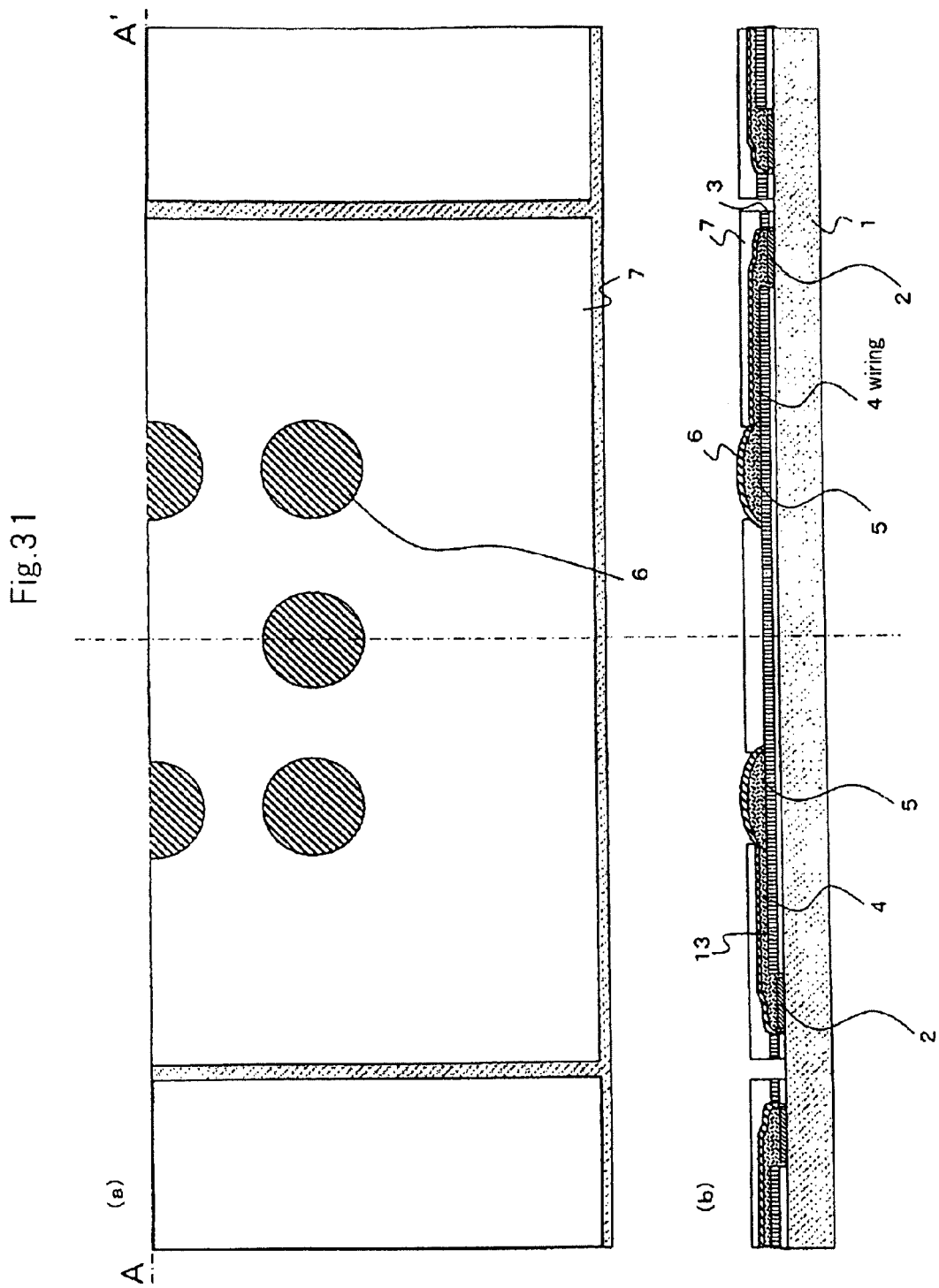
FIG. 31 is a top view and cross-sectional view schematically showing a manufacturing process for the LSI package shown in FIG. 12.

In the stress mitigating layer forming process, stress mitigating layer 13 is formed on first insulating resin 3 (FIG. 29). Stress mitigating layer 13 is preferably an elastic material. Although use of an elastomer or rubber is desirable, a stress mitigating effect can also be realized by providing a gap between silicon and a substrate board on which the package is mounted through use of insulating resin, conductive resin, or metal such as Cu. Further, an improvement in adhesive strength can be achieved by adding a process to roughen the surface of stress mitigating layer 13, or by using a material having a more favorable adhesive strength than the first insulating resin with respect to conducting members such as the conductive resin, conductive ink and the like.

Since processes from the first wiring process (FIG. 30 and FIG. 31) onwards are the same as the processes of the eighth exemplary embodiment (FIG. 26 and FIG. 27), descriptions of these processes are omitted.

According to the above-described LSI package manufacturing method, it is possible to provide a package of high reliability, low environmental impact, and low cost.

Tenth Exemplary Embodiment

The following describes a manufacturing method of the LSI package shown in FIG. 13.

The package manufacturing method of the exemplary embodiment includes a preparation process for preparing a wafer (substrate) including LSI chips, a process for providing a stress mitigating layer on an insulating resin of the LSI chip, a first wiring process for supplying conductive resin or conductive ink by printing and subsequently curing the supplied conductive resin or conductive ink to form wiring and external electrode pads, a plating process for forming a plating layer on the external electrode pads and at least a portion of the wiring, and a process for forming second insulating resin on the plating layer so as to cover peripheral edges of the external electrode pads.

FIG. 32 to FIG. 35 show the LSI package manufacturing processes according to the exemplary embodiment. For each figure, (a) is a top view and (b) is a cross-sectional view taken along line AA' of the top view.

Figure 32:
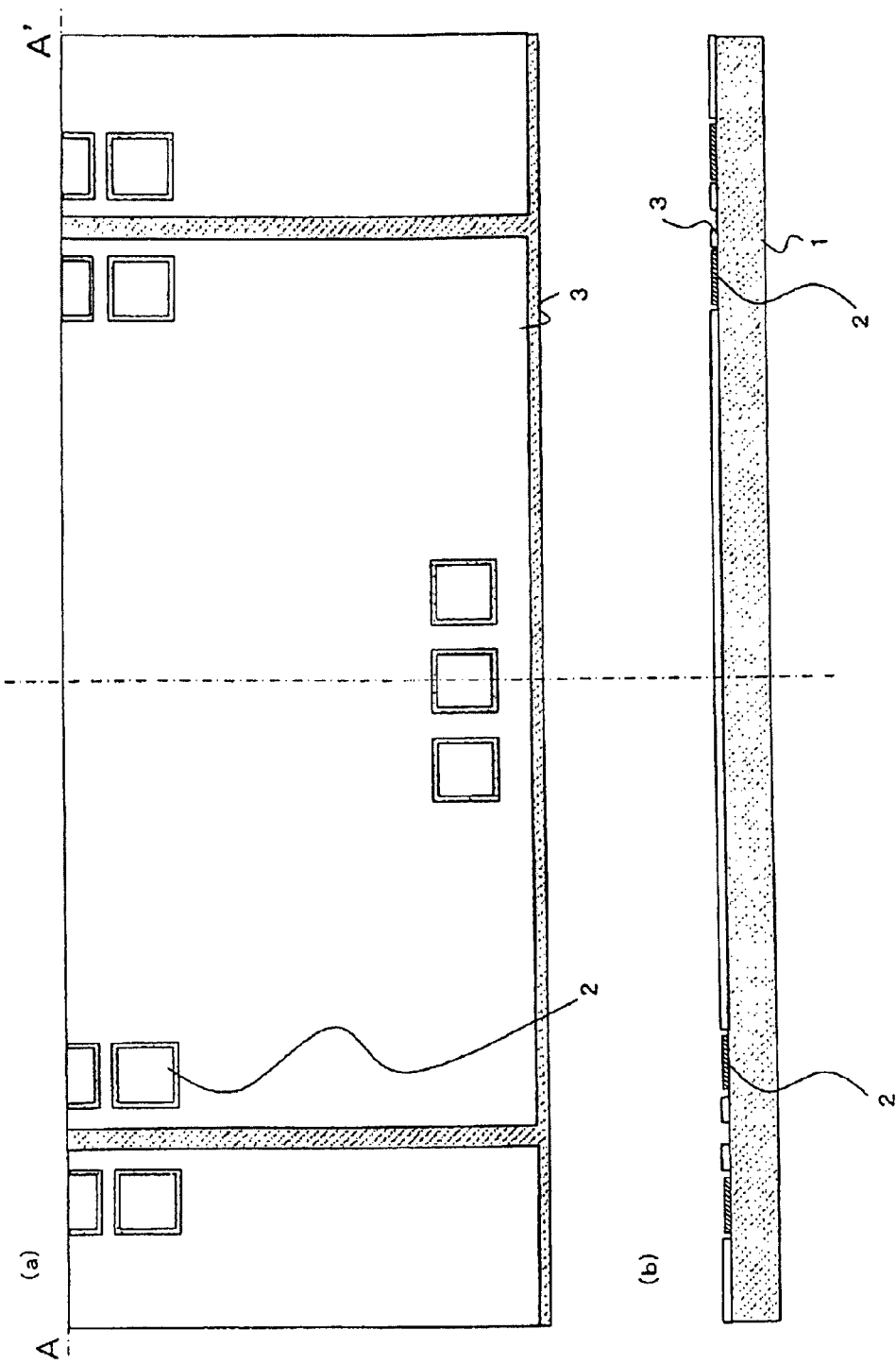
FIG. 32 is a top view and cross-sectional view schematically showing a manufacturing process for the LSI package shown in FIG. 13.

In the preparation process, first insulating resin 3 is formed on the wafer (substrate) including LSI chips which have LSI chip electrode pads 2, so as to include LSI chip electrode pads 2 in openings (FIG. 32). First insulating resin 3 is preferably a passivation film made either of a polyimide or PBO, but may be any material on which wiring can be formed.

Figure 33:
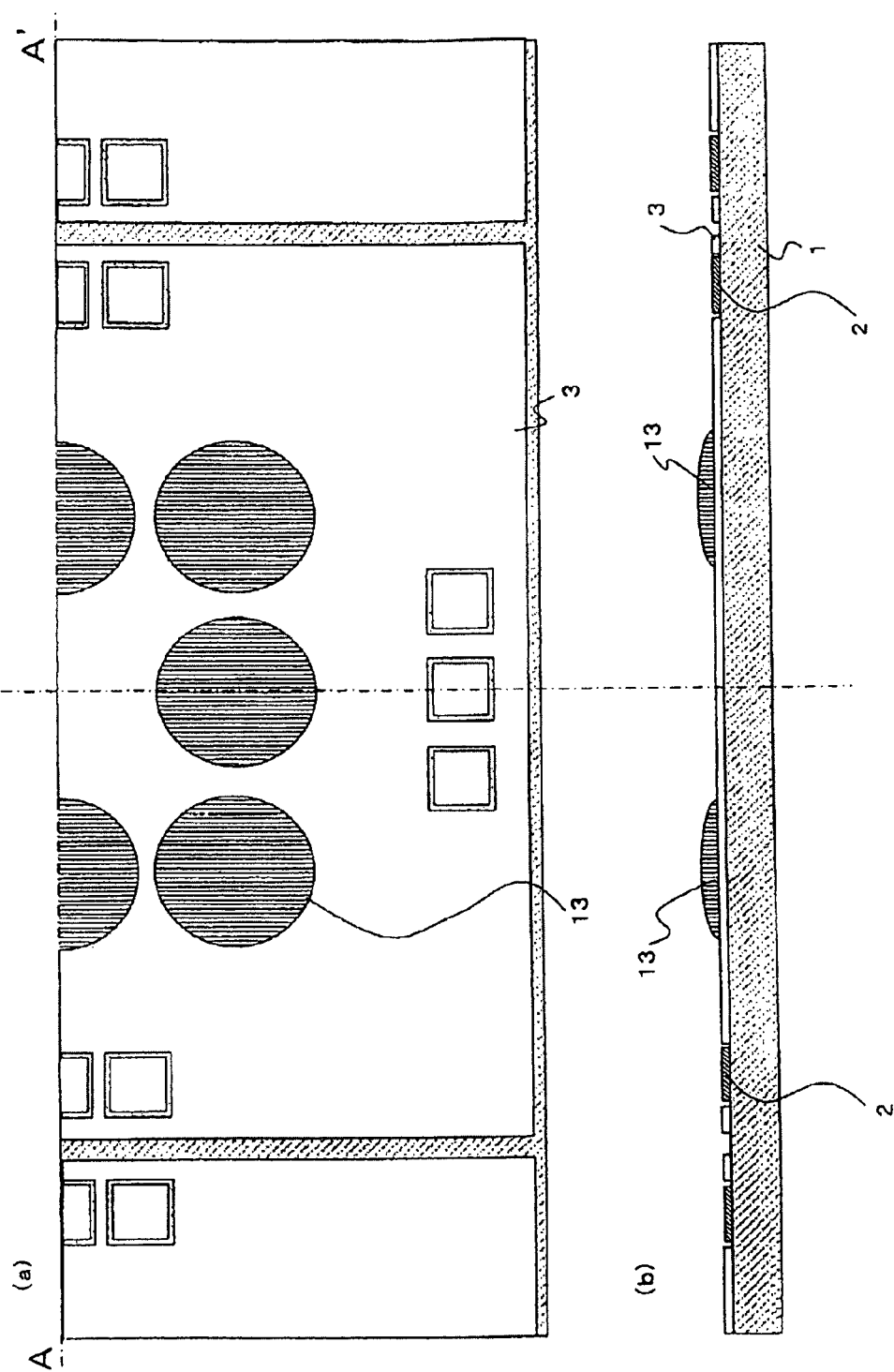
FIG. 33 is a top view and cross-sectional view schematically showing a manufacturing process for the LSI package shown in FIG. 13.

In the stress mitigating layer forming process of the exemplary embodiment, stress mitigating layer 13 is formed on first insulating resin 3 as bottom portions of the external electrode pads (FIG. 33). Stress mitigating layer 13 is preferably an elastic material. Although use of an elastomer or rubber is desirable, a stress mitigating effect can also be realized by providing a gap between silicon and a substrate board on which the package is mounted through use of insulating resin, conductive resin, or metal such as Cu. Further, an improvement in adhesive strength and a simultaneous improvement in the stress mitigating effect and adhesive strength in solder bump portions can be achieved by adding a process to roughen the surface of stress mitigating layer 13, or by using a material having a more favorable adhesive strength than the first insulating resin with respect to conducting members such as the conductive resin, conductive ink and the like.

Since processes from the first wiring process (FIG. 34 and FIG. 35) onwards are the same as the processes of the eighth exemplary embodiment (FIG. 26 and FIG. 27), descriptions of these processes are omitted.

According to the above-described LSI package manufacturing method, it is possible to provide a package of high reliability, low environmental impact, and low cost.

Further, the LSI package manufacturing method of the present invention is not limited to being any of the sixth to tenth exemplary embodiments, and may be an appropriate combination thereof.

Note that the present invention is not limited to the above-described embodiments, and can undergo various modifications within the scope of the invention. These modifications are, of course, included in the scope of the present invention.

The invention claimed is:

1. A semiconductor package comprising:
an external electrode pad which is formed by a conducting member that is made either of conductive resin or conductive ink, said external electrode pad being connected to an internal circuit of a semiconductor device, said external electrode to be electrically connected to an external portion;
a plating layer which is provided on an entire surface of said external electrode pad; and
an insulating resin layer which covers said plating layer on a peripheral edge of said external electrode pad, said insulating resin layer exposing a portion of said plating layer on said external electrode pad,
wherein the insulating resin layer is configured to decrease or prevent peeling from occurring at the conducting member of the external electrode pad and is configured to decrease or prevent cracking from occurring at the peripheral edge of the plating layer upon applying solder on the plating layer, the peeling and the cracking otherwise resulting from contractive forces due to cooling of the solder on the plating layer.

2. The semiconductor package according to claim 1, wherein
at least one layer of wiring formed from either conductive resin or conductive ink is provided for connecting said semiconductor device with said external electrode pad, and
a wiring of an uppermost layer of said at least one layer of wiring is connected to said external electrode pad, said wiring being covered by said plating layer on a surface extending from a connection portion with said external electrode pad to a predetermined region.

3. A semiconductor package comprising:
a semiconductor device which includes a chip electrode pad connected to an internal circuit;
a first insulating resin layer which covers a surface of said semiconductor device, said first insulating resin layer being provided with an opening that exposes a surface of said chip electrode pad;
a wiring which is formed on said first insulating resin layer by a conducting member that is made either of conductive resin or conductive ink, said wiring being connected to said chip electrode pad via said opening;
an external electrode pad which is formed by a member equivalent to said conducting member, said external electrode pad having a surface area larger than said chip electrode pad, said external electrode pad being formed by use of a pitch that is wider than a pitch of said chip electrode pad, said external electrode pad being connected to said wiring;
a plating layer which covers an entire surface of said external electrode pad and, on said wiring, a surface extending from a connection portion with said external electrode pad to a predetermined region; and
a second insulating resin layer which covers said plating layer on a peripheral edge of said external electrode pad, said second insulating resin layer exposing a portion of said plating layer on said external electrode pad,
wherein the first and the second insulating resin layers are configured to decrease or prevent peeling from occurring at the conducting member and are configured to decrease or prevent cracking from occurring at the peripheral edge of the plating layer upon applying solder on the plating layer, the peeling and the cracking otherwise resulting from contractive forces due to cooling of the solder on the plating layer.

4. A semiconductor package comprising:
a semiconductor device which includes a chip electrode pad connected to an internal circuit;
a first insulating resin layer which covers a surface of said semiconductor device, said first insulating resin layer being provided with a first opening that exposes a surface of said chip electrode pad;
a first wiring which is formed on said first insulating resin layer by a conducting member that is made either of conductive resin or conductive ink, said first wiring being connected to said chip electrode pad via said first opening;
a second insulating resin layer which is formed on said first insulating resin layer, said second insulating resin layer being provided with a second opening that exposes a portion of said first wiring;
a second wiring layer which is formed on said second insulating resin by a member equivalent to said conducting member, said second wiring layer being connected to said first wiring via said second opening;
a multilayer wiring layer which includes a desired number of insulating resin layers and wiring layers alternately formed on said second wiring;
an external electrode pad which is formed by a member equivalent to said conducting member, said external electrode pad having a surface area larger than said chip electrode pad, said external electrode pad being formed by use of a pitch that is wider than a pitch of said chip electrode pad, said external electrode pad being connected to uppermost layer wiring of said multilayer wiring layer;
a plating layer which covers an entire surface of said external electrode pad and, on the uppermost layer wiring of said multilayer wiring layer, a surface extending from a connection portion with said external electrode pad to a predetermined region; and
a third insulating resin layer which covers said plating layer on a peripheral edge of said external electrode pad, said third insulating resin layer exposing a portion of said plating layer on said external electrode pad,
wherein the first, the second, and the third insulating resin layers are configured to decrease or prevent peeling from occurring at the conducting member and are configured to decrease or prevent cracking from occurring at the peripheral edge of the plating layer upon applying solder on the plating layer, the peeling and the cracking otherwise resulting from contractive forces due to cooling of the solder on the plating layer.

5. The semiconductor package according to claim 2, wherein said plating layer is formed over an entire surface of said uppermost layer wiring formed by said conducting member.

6. The semiconductor package according to claim 2, wherein said plating layer is formed over an entire surface of all wiring formed by said one or more conducting members.

7. The semiconductor package according to claim 1, wherein a stress mitigating layer is provided on a bottom surface side of said external electrode pad.

8. The semiconductor package according to claim 3, wherein a width of either said wiring or said first wiring is less than or equal to a width of said chip electrode pad portion of said first insulating resin layer.

9. The semiconductor package according to claim 1, wherein a conducting filler of said conductive resin and said conductive ink includes metal particles having a particle dimension of 0.5 μm or more and 5 μm or less.

10. The semiconductor package according to claim 1, wherein a conducting filler of said conductive resin and said conductive ink includes a portion of minute metal particles having a particle diameter of 5 nm or more and 20 nm or less.

11. The semiconductor package according to claim 1, wherein a solder bump is formed on an exposed portion of said plating layer formed on said external electrode pad.

12. A semiconductor package manufacturing method comprising:
    forming, using either conductive resin or conductive ink, an external electrode pad connected with an internal circuit of a semiconductor device, said external electrode pad being electrically connected to an external portion;
    forming a plating layer on an entire surface of said external electrode pad; and
    forming an insulating resin layer which covers said plating layer on a peripheral edge of said external electrode pad, said insulating resin layer exposing a portion of said plating layer on said external electrode pad,
    wherein the second insulatin resin layer is configured to decrease or prevent peeling from occurring at the conducting member and is confi ured to decrease or revent crackin from occurring at the peripheral edge of the plating layer upon applying solder on the plating layer, the peeling and the cracking otherwise resulting from contractive forces due to cooling of the solder on the plating layer.

13. The semiconductor package manufacturing method according to claim 12, further comprising:
    forming, using either conductive resin or conductive ink, at least one wiring layer for connecting said internal circuit with said external electrode pad;
    when forming said external electrode pad, forming uppermost layer wiring of said at least one wiring layer, said uppermost layer wiring being connected to said external electrode pad; and
    when forming said plating layer, covering a surface of said uppermost layer wiring with said plating layer, said surface extending from a connection portion with said external electrode pad to a predetermined region.

14. A semiconductor package manufacturing method comprising:
    forming on a semiconductor device a first insulating resin layer including an opening that exposes a surface of a chip electrode pad connected to an internal circuit of said semiconductor device;
    forming, using a conducting member that is made either of conductive resin or conductive ink, on said first insulating resin layer, an external electrode pad that is to be electrically connected to an external portion, and wiring which connects to said external electrode pad and to said chip electrode pad via said opening, a pitch of said external electrode pad being wider than a pitch of said chip electrode pad and an area of said external electrode pad being larger than an area of said chip electrode pad;
    forming a plating layer which covers an entire surface of said external electrode pad and, on said wiring, a surface extending from a connection portion with said external electrode pad to a predetermined region; and
    forming a second insulating resin layer which covers said plating layer on a peripheral edge of said external electrode pad, said second insulating layer including an opening that exposes a portion of said plating layer on said external electrode pad,
    wherein the first and the second insulating resin layers are configured to decrease or prevent peeling from occurring at the conducting member and are configured to decrease or prevent cracking from occurring at the peripheral edge of the plating layer upon applying solder on the plating layer, the peeling and the cracking otherwise resulting from contractive forces due to cooling of the solder on the plating layer.

15. A semiconductor package manufacturing method comprising:
    forming on a semiconductor device a first insulating resin layer including a first opening that exposes a surface of a chip electrode pad connected to an internal circuit of said semiconductor device;
    forming a first wiring on said first insulating resin layer using a conducting member that is made either of conductive resin or conductive ink, said first wiring being connected to said chip electrode pad via said first opening;
    forming on said first insulating resin layer a second insulating resin layer including a second opening that exposes a portion of said first wiring;
    forming, using a member equivalent to said conducting member, on said second insulating resin layer, a second wiring connected to said first wiring via said second opening;
    forming multilayer wiring which includes a desired number of insulating resin layers and wiring layers alternately formed on said second wiring;
    forming, using a member equivalent to said conducting member, an external electrode pad having a surface area larger than said chip electrode pad by use of a pitch that is wider than a pitch of said chip electrode pad, said external electrode pad being connected to uppermost layer wiring of said multilayer wiring layer;
    forming a plating layer which covers an entire surface of said external electrode pad and, on said uppermost layer wiring of said multilayer wiring layer, a surface extending from a connection portion with said external electrode pad to a predetermined region; and
    forming a third insulating resin layer which covers said plating layer on a peripheral edge of said external electrode pad, said third insulating resin layer including a third opening that exposes a portion of said plating layer on said external electrode pad,
    wherein the first, the second, and the third insulating resin layers are configured to decrease or prevent peeling from occurring at the conducting member and are configured to decrease or prevent cracking from occurring at the peripheral edge of the plating layer upon applying solder on the plating layer, the peeling and the cracking otherwise resulting from contractive forces due to cooling of the solder on the plating layer.

16. The semiconductor package manufacturing method according to claim 12, wherein a method for applying conductive resin and conductive ink is either screen printing, a dispenser method or an inkjet method.

17. The semiconductor package manufacturing method according to claim 12, wherein a method for forming said insulating resin layer includes either screen printing or an inkjet method.

18. The semiconductor package manufacturing method according to claim 14, wherein a method for forming one or more insulating resin layers from said second insulating resin layer to an insulating resin layer of an uppermost layer includes either screen printing or an inkjet method.

19. The semiconductor package manufacturing method according to claim 12, wherein said conductive resin or said conductive ink including, as a conductive filler, metal particles having a particle dimension of 0.5 μm or more and 5 μm or less, is used.

20. The semiconductor package manufacturing method according to claim 12, wherein said conductive resin or said conductive ink including, as a conductive filler, at least a portion of minute metal particles having a particle diameter of 5 nm or more and 20 nm or less, is used.

21. The semiconductor package manufacturing method according to claim 12, further comprising, before forming said external electrode pad, forming a stress mitigating layer in a region corresponding to at least a bottom surface of said external electrode pad.

22. The semiconductor package manufacturing method according to claim 12, further comprising, forming a solder bump on an exposed portion of said plating layer formed on said external electrode pad.

23. The semiconductor package manufacturing method according to claim 12, wherein manufacturing processes of the semiconductor package are performed in a wafer, and said wafer is subsequently divided to form separate semiconductor packages.

* * * * *